(12) United States Patent
Xian et al.

(10) Patent No.: US 12,423,495 B2
(45) Date of Patent: Sep. 23, 2025

(54) CURRENT-DISTRIBUTING PIN STRUCTURE AND METHOD OF FORMING SAME

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Huaixin Xian, Hsinchu (TW); Zhang-Ying Yan, Hsinchu (TW); Jibao Zhang, Hsinchu (TW); Qingchao Meng, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 725 days.

(21) Appl. No.: 17/669,306

(22) Filed: Feb. 10, 2022

(65) Prior Publication Data

US 2023/0244846 A1 Aug. 3, 2023

(30) Foreign Application Priority Data

Jan. 30, 2022 (CN) .......................... 202210113341.4

(51) Int. Cl.
*H01L 23/522* (2006.01)
*G06F 30/392* (2020.01)
*H01L 21/768* (2006.01)

(52) U.S. Cl.
CPC .......... *G06F 30/392* (2020.01); *H01L 21/768* (2013.01); *H01L 23/5226* (2013.01)

(58) Field of Classification Search
CPC .... G06F 30/392; G06F 30/394; G06F 30/398; H01L 21/768; H01L 23/5226; H01L 23/5222; H01L 23/528
See application file for complete search history.

(56) References Cited

U.S. PATENT DOCUMENTS

| 7,260,442 | B2 | 8/2007 | Hwang et al. |
| 8,581,348 | B2 * | 11/2013 | Rashed ............. H01L 21/76895 257/369 |
| 8,853,794 | B2 * | 10/2014 | Becker .................. H01L 27/088 257/E27.028 |
| 9,256,709 | B2 | 2/2016 | Yu et al. |

(Continued)

FOREIGN PATENT DOCUMENTS

| TW | 201362 | 3/1993 |
| TW | 202018949 | 5/2020 |

*Primary Examiner* — Eugene Lee
(74) *Attorney, Agent, or Firm* — Hauptman Ham, LLP

(57) ABSTRACT

A current-distributing structure in an integrated circuit (IC) includes a substrate; and first and second active regions on the substrate. First and second sets of gate structures correspondingly overlap the first and second active regions. A first conductive structure in a first metallization layer overlaps the first active region and is electrically coupled to the first set of gate structures. A second conductive structure in the first metallization layer overlaps the second active region and is electrically coupled to the second set of gate structures. A third conductive structure in a second metallization layer is electrically coupled to the first and the second conductive structures.

20 Claims, 23 Drawing Sheets

(56) References Cited

U.S. PATENT DOCUMENTS

| | | | |
|---|---|---|---|
| 9,767,248 B2* | 9/2017 | Song | G06F 30/398 |
| 10,249,605 B2* | 4/2019 | Subhash | H01L 23/5283 |
| 10,312,229 B2* | 6/2019 | Moroz | H01L 29/4238 |
| 2014/0027918 A1* | 1/2014 | Rashed | H01L 27/11807 |
| | | | 257/E21.59 |
| 2014/0040838 A1 | 2/2014 | Liu et al. | |
| 2015/0278429 A1 | 10/2015 | Chang | |
| 2018/0166431 A1* | 6/2018 | Lin | H01L 21/823437 |
| 2020/0135640 A1* | 4/2020 | Sio | H01L 23/5226 |
| 2020/0135721 A1* | 4/2020 | Do | H01L 27/0705 |
| 2021/0183859 A1* | 6/2021 | Jeong | H01L 29/78696 |

* cited by examiner

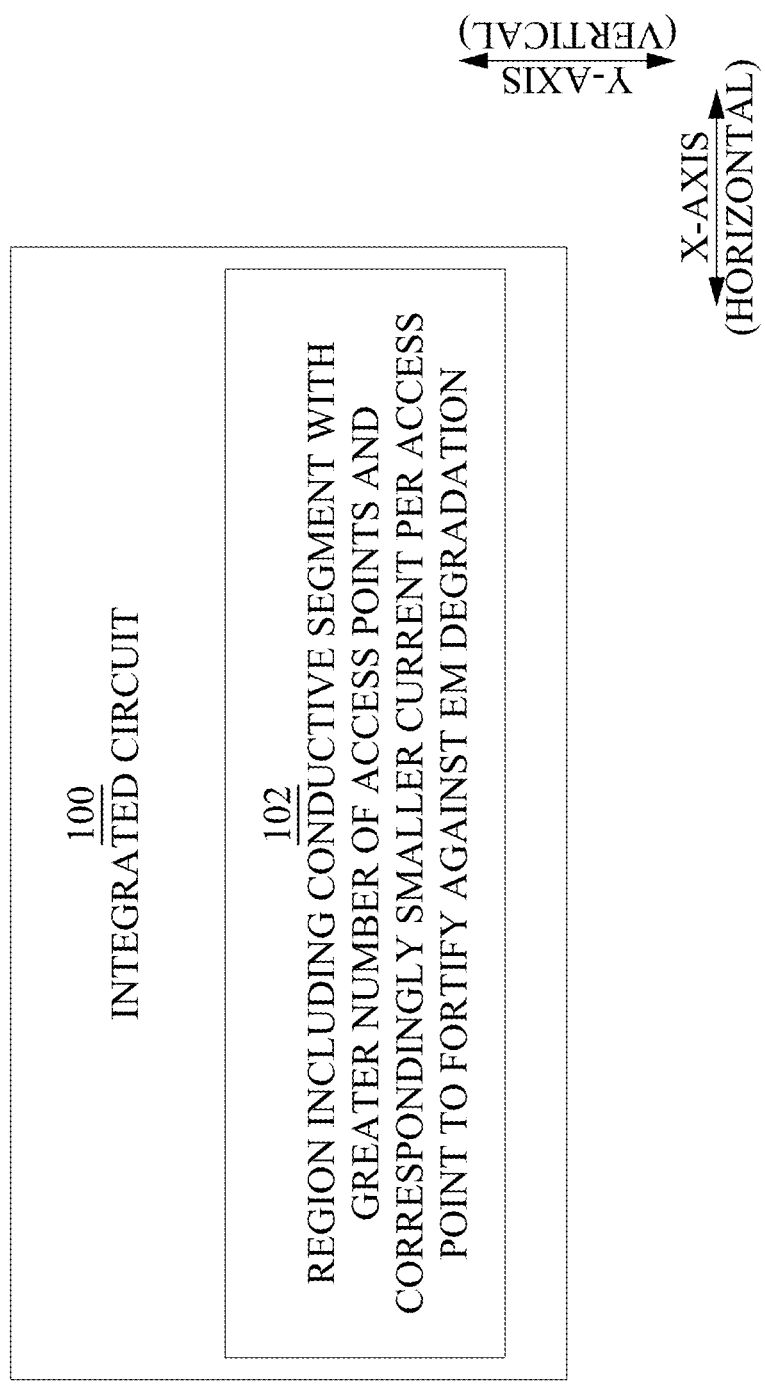

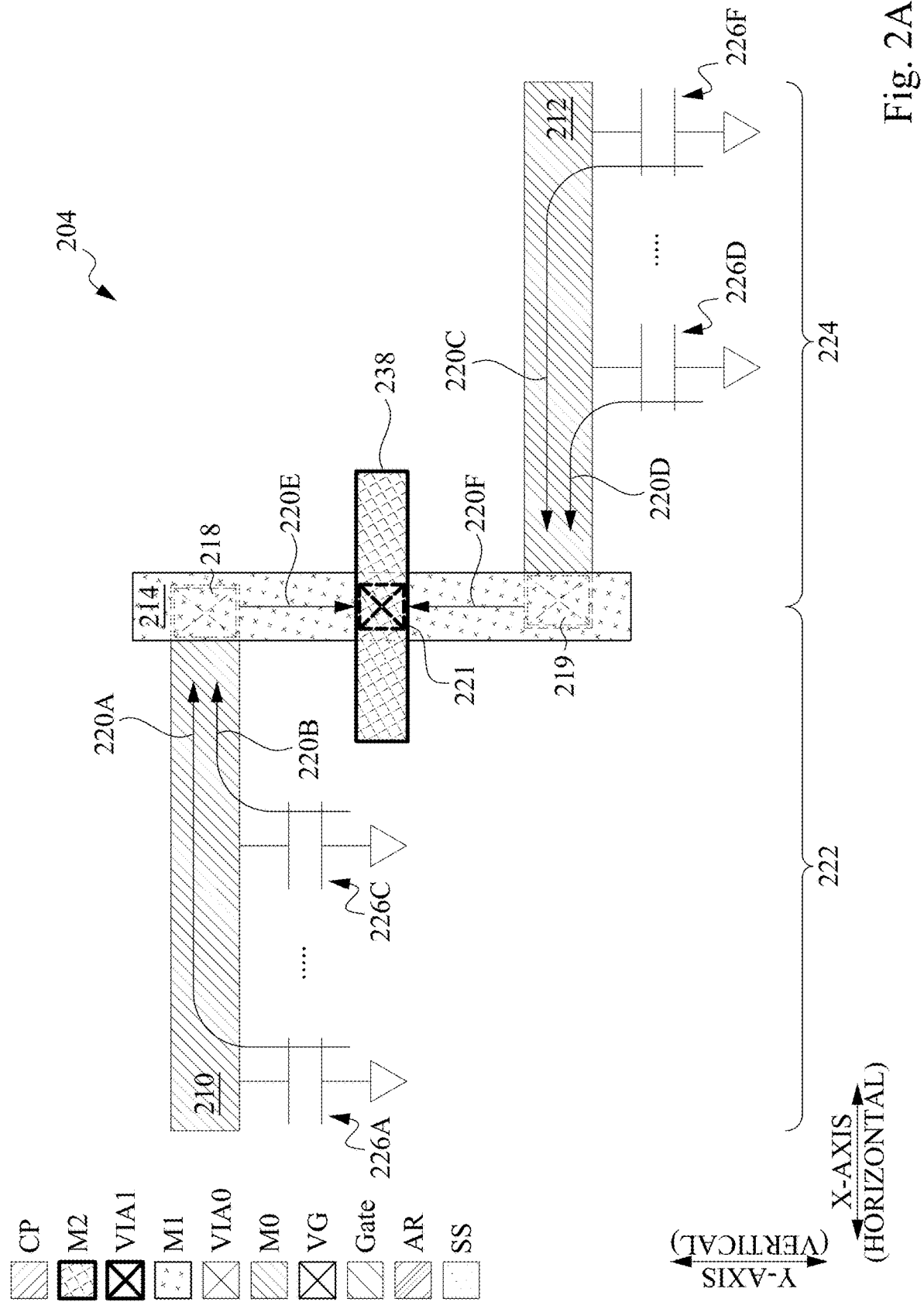

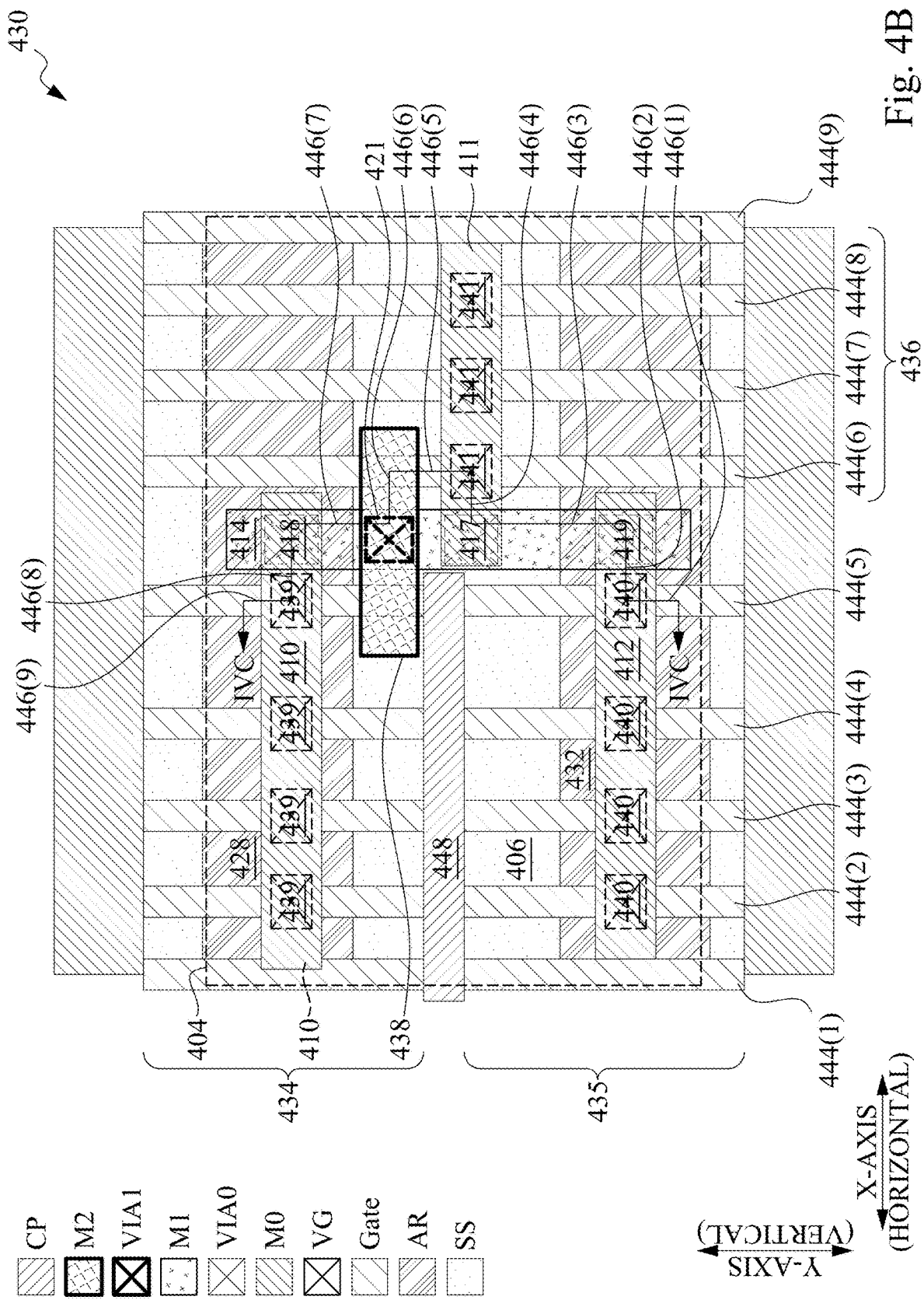

CURRENT-DISTRIBUTING PIN STRUCTURE AND METHOD OF FORMING SAME

BACKGROUND

In metal, electromigration (EM) is the transport of material caused by the movement of cations, i.e., positive ions of the metal ions, in a conductor due to a momentum transfer between conducting electrons, i.e., electrons in motion, and the cations. The transportation of conductor material has the potential to create breaks in the conductor creating an open circuit and thereby preventing current flow. There is also the potential to transport conductor material to adjacent conductors and create an electrical short circuit. EM is observed in applications where high direct current (DC) densities are used, such as microelectronics and related structures. As the structure size in electronics, such as integrated circuits (ICs), decreases, the practical significance of EM increases.

With increasing miniaturization, the probability of failure due to EM increases in very large scale integration (VLSI) and ultra-large scale integration (ULSI) circuits as the current density increases (e.g., as conductors decrease in size, the current density increases). Specifically, conductive line widths as well as conductive line cross-sectional areas continue to decrease over time as integrated circuits (ICs) grow smaller. While currents are reduced, as supply voltages are lowered, and gate capacitances continue to shrink, current reduction is constrained by increasing frequencies. In a capacitive circuit, as frequency increases so does current and thus current density. Further, the greater the decrease in cross-sectional areas without comparable current reduction, the greater the rise in current densities for ICs and thus the greater risk of EM.

BRIEF DESCRIPTION OF THE DRAWINGS

Aspects of the present disclosure are best understood from the following detailed description when read with the accompanying FIGS. It is noted that, in accordance with the standard practice in the industry, various features are not drawn to scale. In fact, the dimensions of the various features may be arbitrarily increased or reduced for clarity of discussion.

FIG. 1 is a block diagram of an integrated circuit (IC) that includes a region with multi-access point inputs, in accordance with some embodiments.

FIG. 2A is a partial layout diagram of a current-distributing input pin structure, in accordance with some embodiments.

FIG. 4B is a layout drawing of a semiconductor device, in accordance with some embodiments.

DETAILED DESCRIPTION

Figure 2B:
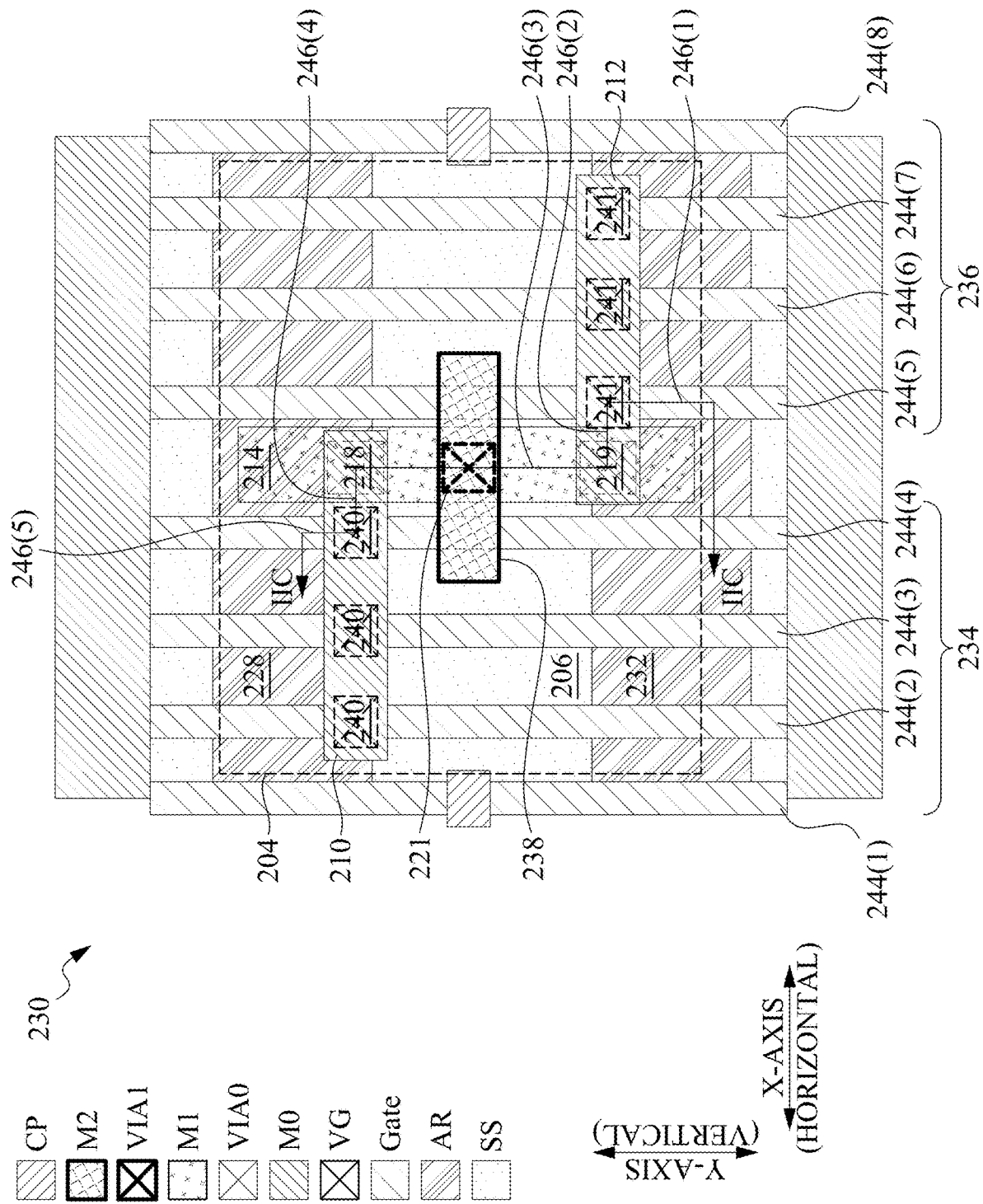
FIG. 2B is a layout drawing of a semiconductor device, in accordance with some embodiments.

Without being bound by theory, explanations of underlying physics are provided herein. The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

In some embodiments, a semiconductor device has a metallization layer that includes an input pin with a greater number of access points, i.e., vias, as compared to another approach. A benefit of the increased number of access points of some embodiments is that the root mean square (RMS) per access-point input current is lowered by at least by 20% as compared to the other approach. In some embodiments, the RMS per access-point input current is lowered by more than about 20%. In some embodiments, the RMS per access-point input current is lowered by up to about 50%. In some embodiments, the RMS of an AC current is the value of a DC current that would produce the same power dissipation in a resistive load. In some embodiments, the reduction in RMS per access-point current is realized in a first layer of metallization.

In some embodiments, a semiconductor device with a first layer of metallization (M_1st layer) includes a first conductive structure on a first side of the semiconductor device and a second conductive structure on a second side of the semiconductor device. In some embodiments, each of the first conductive structure and second conductive structure are each electrically coupled to a second layer of metallization (M_$2^{nd}$ layer). In some embodiments, the M_$2^{nd}$ layer forms a third conductive structure that is an input pin. In some embodiments, the third conductive structure is electrically coupled to the first conductive structure at a first location (e.g., access point) and electrically coupled to the second conductive structure at a second location (e.g., access point). In some embodiments, the separation of the M_$1^{st}$ layer into a first and second conductive structure reduces the current density at each of the first and the second access points. In some embodiments, multiple access points electrically coupling the M_$1^{st}$ layer with the M_$2^{nd}$ layer for the first conductive structure, the second conductive structure, and the third conductive structure prevent a cumulative current density at one access point on the input pin (M_$2^{nd}$ layer). In some embodiments, the lowering of the current density at access points on the input pin prevents or significantly reduces the risk of EM degradation. In some embodiments, the M_$2^{nd}$ layer includes two or more access points distributing the current and preventing or significantly reducing EM. In some embodiments, the semiconductor device height does not change with the modification to the M_$1^{st}$ and M_$2^{nd}$ layers. In some embodiments, this structural change is performed with minimal modifications to any standard semiconductor device.

FIG. 1 is a block diagram of an integrated circuit (IC) 100 that includes a region 102 with multi-access point inputs, in accordance with some embodiments.

In some embodiments, IC 100 includes a region 102 that includes a conductive segment with a greater number of access points and correspondingly smaller currents being passed through the access points to fortify against EM degradation, i.e., a reduced current per access point. In some embodiments, IC 100 is a monolithic IC (also referred to as a chip, or a microchip) that is a set of electronic circuits on one flat piece (e.g., a chip or a substrate) of semiconductor material, e.g., silicon. In some embodiments, IC 100 includes large numbers of metal oxide semiconductor (MOS) transistors on the substrate.

In some embodiments, IC 100 includes logic circuits, and/or memory circuits, and/or the like. In some embodiments, IC 100 includes miniaturized electronic components built into an electrical network on a monolithic semiconductor substrate by photolithography.

In some embodiments, IC 100 includes microprocessors, field-programmable gate arrays (FPGAs), memories (e.g., RAM, ROM, and flash) and application-specific integrated circuit (ASICs). In some embodiments, IC 100 includes op-amps, linear regulators, phase locked loops, oscillators and active filters.

Figure 2C:
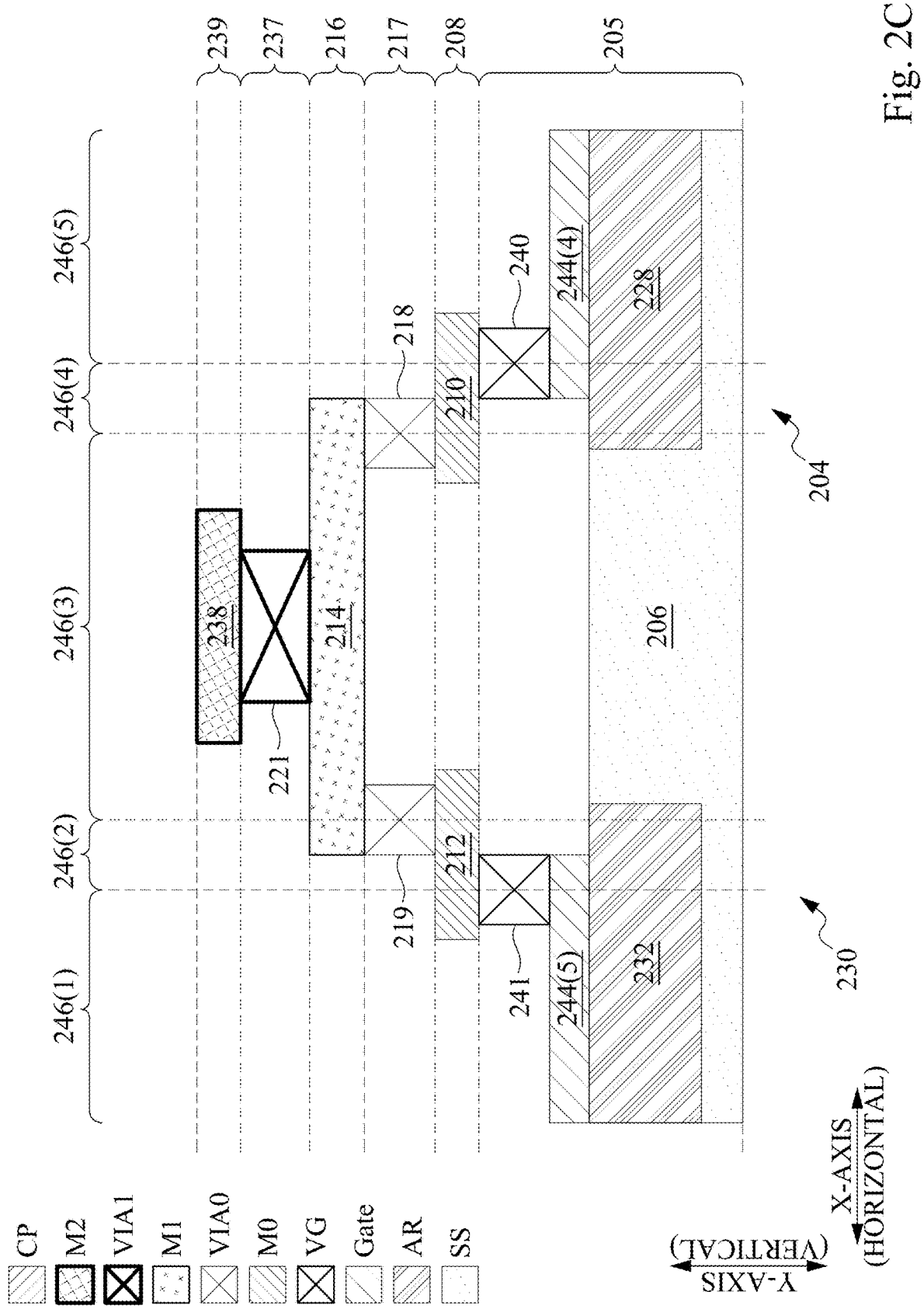
FIG. 2C is an offset cross-sectional view of a semiconductor device, in accordance with some embodiments.

FIGS. 2A and 2B are corresponding are layout diagrams, in accordance with some embodiments. FIG. 2B is a layout diagram of a semiconductor device with a current-distributing input pin structure 204 of FIG. 2A, in accordance with some embodiments. FIG. 2A is a simplified version of FIG. 2B. FIG. 2A includes capacitors 226A-226F which are not shown in FIG. 2B; capacitors 226A-226F in FIG. 2A represent parasitic capacitances and are included in FIG. 2A to provide context for a mathematical representation of RMS current (see below). FIG. 2C is an offset cross-sectional view of the semiconductor device of FIG. 2B, in accordance with some embodiments; accordingly the corresponding sectional view line IIC in FIG. 2B is offset or stepped, and includes segments 246(1), 246(2), 246(3), 246(4) and 246(5) which represent corresponding like-numbered portions of FIG. 2C.

The layout diagrams of FIGS. 2A-2B are representative of a structure in a semiconductor device. In FIGS. 2A-2B, structures in the semiconductor device are represented by shapes (also known as patterns) in the layout diagram. For simplicity of discussion, elements in the layout diagrams of FIGS. 2A-2B (and of other figures included herein) will be referred to as if they are structures rather than shapes per se. For example, shape 228 in FIG. 2B represents active region 228 in FIG. 2C (also known as an oxide-dimensioned (OD) region); in the following discussion, element 228 is referred to as active region 228.

In layout diagrams of FIGS. 2A-2B, current-distributing input pin structure 204 is used in IC 100 in region 102 that includes a conductive segment with a greater number of access points and correspondingly smaller currents being passed through the access points to fortify against EM degradation.

In some embodiments, an IC, such as IC 100, includes a substrate (206 FIGS. 2B-2C) that includes first and second active regions (228, 232, FIGS. 2B & 2C) that correspondingly extend in a first direction (along the X-axis in FIGS. 2A-2B) on substrate 206. Second active region (232 FIGS. 2B & 2C) is separated from first active region (228 FIGS. 2B & 2C) in a second direction (along the Y-axis in FIGS. 2A-2B) substantially perpendicular to the first direction. In some embodiments, the first and second directions are directions other than the directions correspondingly of the X-axis and the Y-axis. IC 100 further includes gate structures 244(1), 244(2), 244(3), 244(4), 244(5), 244(6), 244(7), 244(8) and 244(9). The gate structures are organized into a first set that includes gate structures 244(1)-244(4) and second set that includes gate structures 244(5)-244(8). Relative to the Y-axis, a cut pattern (CP) overlaps an approximate mid-line of a corresponding gate structure. In FIG. 2B, a cut pattern overlaps each of gate structures 244(1) and 244(8), which indicates that each of gate structures 244(1) and 244(8) has a corresponding upper portion which is electrically isolated from a corresponding lower portion. In some embodiments, first and second sets of gate structures (234, 236, FIG. 2B) extend in the second direction and correspondingly overlap the first and second active regions (228, 232, FIG. 2B). In some embodiments, a first conductive structure 210 in a first layer of metallization (M_1st layer) (see 208 FIG. 2C) extends in the first direction, at least partially overlapping the first active region (228 FIGS. 2B & 2C), and is electrically coupled to the first set of gate structures (234 FIG. 2B). First conductive structure 210 overlaps gate structures 244(2)-244(4). In some embodiments, a second conductive structure 212 in M_1st layer 208 extends in the first direction, at least partially overlapping the second active region (232 FIGS. 2B & 2C), and is electrically coupled to the second set of gate structures (236 FIG. 2B). Second conductive structure 212 overlaps gate structures 244(5)-244(7). In some embodiments, a third conductive structure 214 in a second layer of metallization (M_2 nd layer) (see 216 FIG. 2C) extends in the second direction. Third conductive structure 214 is electrically coupled to, and at least partially overlapping of, first conductive structure 210 and second conductive structure 212 through vias 218 and 219. Vias 218 and 219 are in a first layer of interconnection (V_1st layer) (see 217 FIG. 2C). In some embodiments, depending upon the numbering convention of the corresponding process node by which such a semiconductor device is fabricated, M_1st layer 208 is either metallization layer zero, M0, or metallization layer one, M1, and correspondingly the V_1st layer of interconnection is either VIA0 or VIA1 In some embodiments, M0 is the first layer of metallization above a transistor layer (see 205 FIG. 2C). In FIG. 2C, transistor layer 205 includes substrate 206, active regions 228 and 232, gate structure 244(4) and 244(5) and via-to-gate (VG) structures 240 and 241.

In some embodiments, substrate 206 is a thin slice of semiconductor, such as a crystalline silicon (c-Si), used for the fabrication of ICs. In some embodiments, substrate 206 serves as the base for microelectronic devices built in and upon substrate 206. In some embodiments, the substrate undergoes many microfabrication processes, such as doping, ion implantation, etching, thin-film deposition of various materials, and photolithographic patterning.

In some embodiments, donor impurity atoms, such as boron or phosphorus in the case of silicon, can be added to intrinsic substrate material in precise amounts in order to dope the crystal, thus changing it into an extrinsic semiconductor of n-type or p-type. In some embodiments, these n-type or p-type semiconductor regions, are referred to as active regions, e.g., active regions (228, 232 FIGS. 2B & 2C).

In some embodiments, first and second sets of gate structures (234, 236, FIG. 2B) are made from a material including metal, e.g., aluminum, or polysilicon. In some embodiments, in a MOS transistor, an application of a voltage to any one gate of first and second sets of gate structures (234, 236, FIG. 2B) in turn alters the conductivity between active regions (228, 232 FIGS. 2B & 2C).

In some embodiments, M_$1^{st}$ layer 208 and a third layer of metallization (M_$3^{rd}$ layer) (see 239 FIG. 2C) are conductive layers extending along the X direction, and M_2 nd layer 216 is a conductive layer extending in the Y direction. In some embodiments, M_$1^{st}$ layer 208 extends over each of via-to-gate (VG) structures (VG structures 240 and 241 FIG. 2B) and M_$2^{nd}$ layer 216 over each of vias 218 and 219, and is thereby configured to provide a low resistance path between VG structures 240 and 241 and vias 218 and 219. A conductive segment is a volume configured to provide a low electrical resistance path by including one or more conductive materials, e.g., a metal such as copper, aluminum, tungsten, or titanium, polysilicon, or another material capable of providing a low resistance path. In some embodiments, a conductive segment includes one or more conductive materials configured as one or more barrier layers.

In some embodiments, current through first conductive structure 210 is represented by arrows 220A and 220B. In some embodiments, current 220A and 220B are currents conducted to first conductive structure 210 through one or more gate structures of the first set (234 FIG. 2B). In some embodiments, currents 220A, 220B are currents from left side 222 of current-distributing input pin structure 204 where the first set of gates (234 FIG. 2B) is located.

In some embodiments, current through second conductive structure 212 is represented by arrows 220C and 220D. In some embodiments, current 220C and 220D are currents conducted to second conductive structure 212 through one or more gate structures of the second set (236 FIG. 2B). In some embodiments, currents 220C, 220D are currents from right side 224 of current-distributing input pin structure 204 where second set of gate structures (236 FIG. 2B) are located.

In some embodiments, current 220A, 220B are conducted to third conductive structure 214 through via 218 that electrically couples first conductive structure 210 to third conductive structure 214. In some embodiments, current 220C, 220D are conducted to third conductive structure 214 through via 219 that electrically couples second conductive structure 212 to third conductive structure 214. In some embodiments, current 220A, 220B combine as current 220E and current 220C, 220D combine as current 220F that are conducted through via 221 that electrically couples conductive structure 214 with a conductive structure 238 in M_$3^{rd}$ layer 239, where via 221 is in a second layer of interconnection (V_2nd layer) (237 FIG. 2C).

Figure 4A:
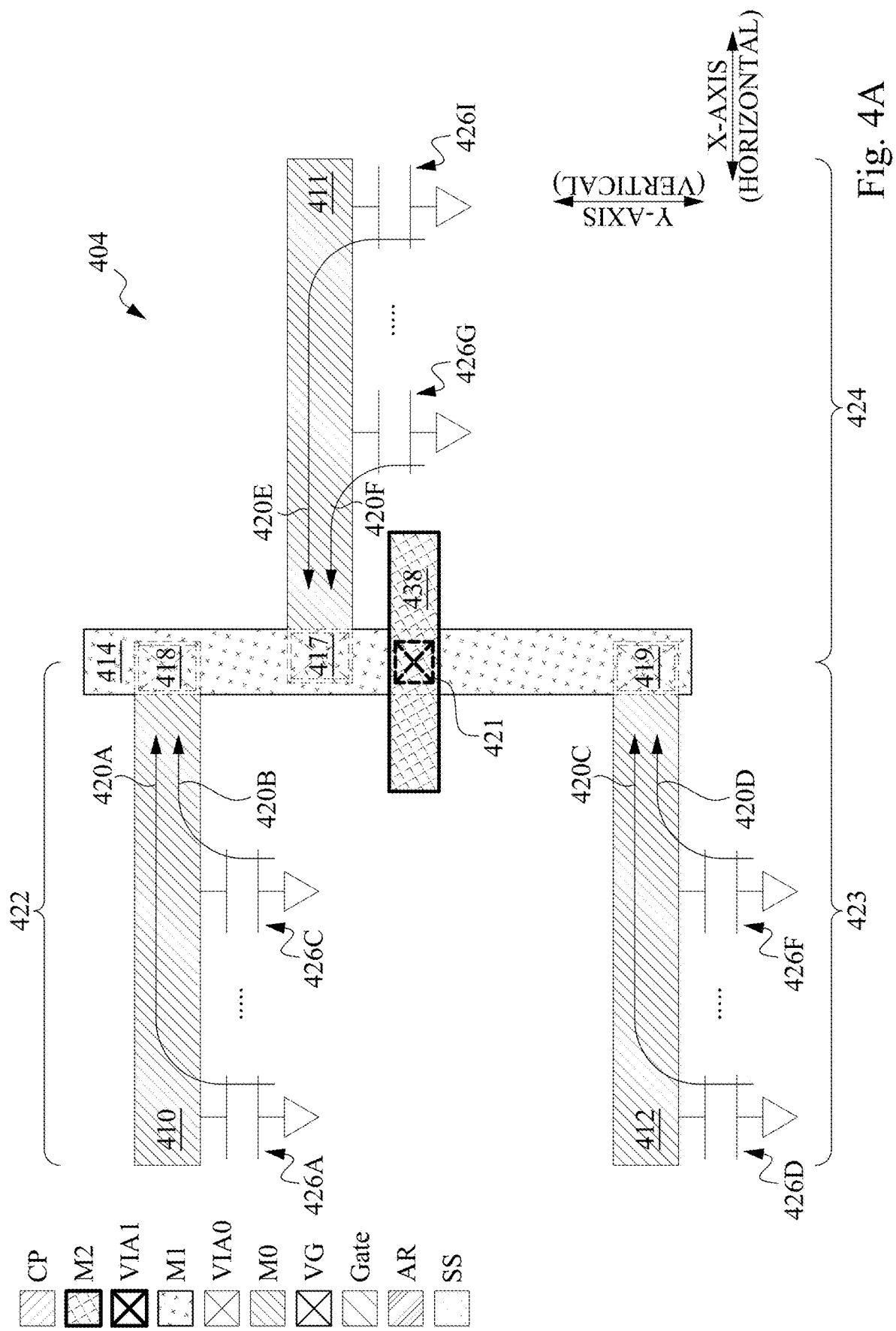
FIG. 4A is a partial layout diagram of a current-distributing input pin structure, in accordance with some embodiments.
Figure 4C:
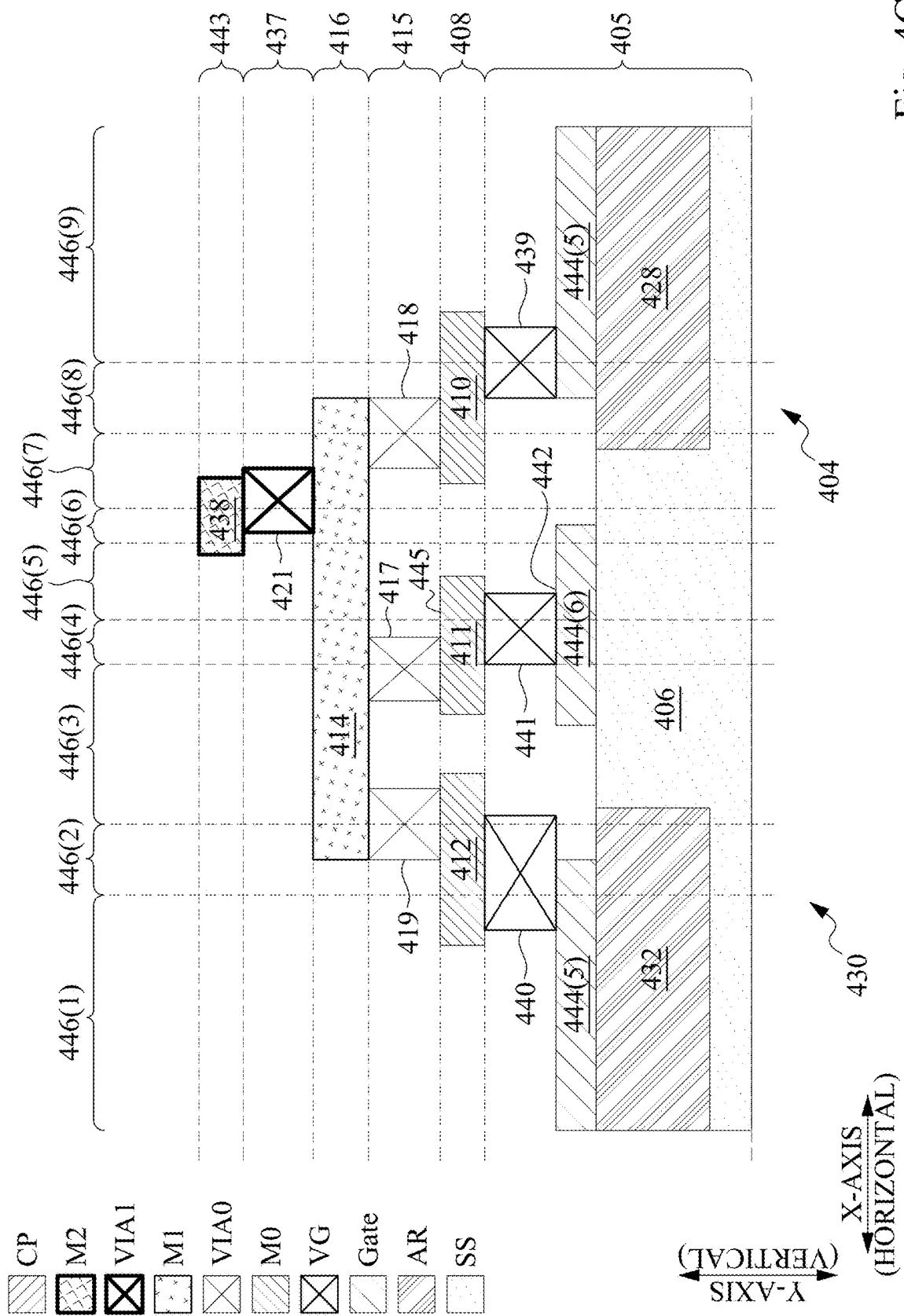
FIG. 4C is an offset cross-sectional view of a semiconductor device, in accordance with some embodiments.

In comparison with the other approach that uses the cross-type pin, where the current through a single conductive structure in M_$1^{st}$ layer is electrically coupled to the corresponding single conductive structure in the M_$2^{nd}$ layer through a single access point, i.e., a single via, in the embodiment of FIGS. 2A-2C, currents 220A and 220B from first conductive structure 210 are electrically coupled through via 218 to conductive structure 214 and currents 220C and 220D from second conductive structure 212 are electrically coupled through via 219 to conductive structure 214. As such, a benefit of some embodiments is that the total current coming into conductive structure 214 is distributed through two vias, namely vias 218 and 219. In some embodiments, the RMS current is effectively reduced by half at vias 218 and 219 as compared to the other approach. In some embodiments, as the number of conductive structures in the M_1st layer and corresponding number of vias increases beyond two, the RMS current per via is correspondingly reduced. In some embodiments, the current per via is about 1/N, where N is a positive integer that represents the number of vias. For example, incorporating two access points, such as vias 218 and 219 at third conductive structure 214 effectively reduces the RMS current through each of vias 218 and 219 by half. Three access points, i.e., three vias, such as is shown in FIGS. 4A, 4B, and 4C effectively reduces the RMS current through each access point by ⅔, i.e., each of the vias conducts ⅓ as much current as the single via in the cross-type pin according to the other approach.

In FIG. 2A, currents (represented by arrows 220A, 220B, 220C and 220D) are shown in first conductive structure 210 and second conductive structure 212. In other approaches, such as the cross-type approach, currents 220A, 220B, 220C, and 220D are combined at a single access point. Thus, in other approaches the combined current in a conductive structure accumulates at one access point. In some embodiments, a semiconductor device has a conductive structure 214 that includes an input pin with a greater number of access points 218, 219, i.e., vias, as compared to another approach. A benefit of the increased number of access points of some embodiments is that the root mean square (RMS) per access-point input current is lowered at least by 20% as compared to the other approach. In some embodiments, the RMS of an AC current is the value of a DC current that would produce the same power dissipation in a resistive load.

$$I_{RMS}=0.707 \cdot I_{ACMax}=I_{DC}=\text{Effective Current} \quad \text{eq. (1)}$$

In FIG. 2C, for a given conductive structure in M_1st layer 208, distributing current amongst multiple access points (vias 218 and 219 in V_1st layer 217) for the input pin prevents or deters EM degradation by lowering RMS current per access point (per via 218 and 219 in V_1st layer 217), and thus current density. Current density is the amount of charge per unit time that flows through a unit area of a chosen cross section. A current density vector ($\vec{J}$) is defined as a vector whose magnitude is the electric current per cross-sectional area at a given point in space. The vector's direction being that of the motion of the positive charges at a point.

In other approaches, especially in the automotive industry, EM is an issue due to higher gradients of temperature and lower changes in temperature over time. The governing equation that describes the atom concentration through an interconnect segment, e.g., an access point such as a via, is the mass balance continuity equation. Mass atomic flux appears in some equations in hydrodynamics, in particular the continuity equation is a statement of the mass conservation of fluid. In hydrodynamics, mass can only flow from one place to another.

$$\frac{\partial N}{\partial t} + \nabla \cdot \vec{J} = 0 \quad \text{eq.: (2)}$$

where N($\vec{x}, \vec{y}, \vec{z}$), t)

Equation 3, below, shows the major contributions to total atomic flux. Atomic flux is the diffusion of atoms. Such diffusion of atoms along with momentum transfer between conducting electrons causes EM degradation. Thus, controlling or lowering atomic flux assists in preventing or controlling EM degradation.

$$\vec{J} = \vec{J}_c + \vec{J}_T + \vec{J}_\sigma + \vec{J}_N \quad \text{eq.: (3)=}$$

Total current density is a combination of electric current ($\vec{J}_c$), gradients of temperature ($\vec{J}_T$), mechanical stress ($\vec{J}_\sigma$), and atom concentration ($\vec{J}_N$). Thus, as temperature increases (and assuming that all other variables remain substantially constant), such as in an automotive application with engine heat, there is an increased possibility of elevated atomic flux and thus EM degradation.

In some embodiments, where temperature is high and does not change much over time or changes very little, a technique to mitigate the otherwise increased risk of EM is to lower the current. Thus, as in FIG. 2A, by lowering the current RMS (e.g., splitting currents 220A, 220B and 220C, 220D), the possibility of EM degradation is decreased.

Current, at any point such as at an access point, e.g., vias 218 or 219 in FIG. 2B, is represented by Ohm's law at a specific point in time.

$$I(t) = \frac{V(t)}{R} \quad \text{eq.: (4)}$$

Stating Equation (4) in words, the current at time (t) is the voltage at time (t) divided by the resistance of the access point. Incorporating total impedance of the access point yields:

$$I(t) = \frac{V(t)}{R + \frac{1}{jwC}} \quad \text{eq.: (5)}$$

where $j=\sqrt{-1}$, $w=2*\pi*f$; where f=frequency, and C is the capacitance of the access point.

Solving for current, the RMS is:

$$I(t) = \sqrt{\frac{V^2(t)}{R^2}\left(1 - \frac{1}{1+w^2R^2C^2}\right)} \quad \text{eq.: (6)}$$

According to equation (6), as capacitance increases (e.g., figuratively represented by parasitic capacitors 226A-226F in FIG. 2A), the RMS current increases, and as temperature increases, the RMS current increases. Thus when situations are right, such as an environment with elevated temperature (e.g., in applications close to a vehicle engine that operates between 195° F. to 220° F. or 91° C. to 105° C.), EM degradation is more likely to occur.

In other approaches, the arrangement of conductive segments in the M_1$^{st}$ layer and M_2$^{nd}$ layer is referred to colloquially as a cross-type pin. Regarding a cross-type pin, the conductive segment in the M_2$^{nd}$ layer extends vertically, crosses over and is electrically coupled to the conductive segment in the M_1$^{st}$ layer, the latter extending horizontally across the semiconductor device. Together, the conductive segments in the M_1$^{st}$ layer and M_2$^{nd}$ layer resemble a cross or the letter X. In this other approach, all current is routed through one access point, i.e., one via, which electrically couples the conductive segment in the M_1$^{st}$ layer to the conductive segment in the M_2$^{nd}$ layer.

In FIG. 2A, the capacitance of the VG structures (240, 241 FIGS. 2B & 2C) is represented figuratively by parasitic capacitors 226A-226F, where parasitic capacitors 226A, 226C, 226D and 226F are shown in FIG. 2A, but parasitic capacitors 226B and 226E are not shown (for simplicity of illustration). Further, the capacitance of all access points on the M_1$^{st}$ layer are additive as they are in parallel. Therefore, referring to equation (6) above, capacitance is maximized in the semiconductor device as the capacitance of each via-to-gate (VG) structure, on a given conductive structure in the M_1$^{st}$ layer is cumulative. In the other approach, a conductive structure in the M_3$^{rd}$ layer is added to form an additional input pin coupled to another conductive structure in the M_2$^{nd}$ layer through an additional via. However, this other approach limits the automatic placement and routing (APR) performance during circuit manufacturing (e.g., the ability to route and place other elements in a circuit design).

In other approaches, pillars (conductive structures in M_3$^{rd}$ layers) interconnect with multiple input pins to relieve the excessive current at the input pins. However, adding additional input pins and/or pillars according to the other approaches limit routing resources for the circuit, increase the APR flow as the circuit's flexibility is limited, and parasitic capacitance remains an issue with the added metal layers.

In FIG. 2A, the capacitance of the VG structures (240, 241 FIGS. 2B & 2C) is represented figuratively by capacitors 226A-226F, where capacitors 226A, 226C, 226D and 226F are shown in FIG. 2A but capacitors 226B and 226E are not shown (for simplicity of illustration). With reference to equation (6), in some embodiments, as capacitance is lowered, the RMS current is proportionately reduced. In FIG. 2B, the ratio of the number of VG structures that feed current to a via in V_1st layer, e.g., vias 218 and 219, through a corresponding conductive structure in M_1st layer 208 is reduced by half as compared to ratio of the cross-type pin according to the other approach. Accordingly, in FIG. 2B, the reduction in capacitance due to the reduced ratio of the number of VG structures to a given via in the V_1st layer helps to reduce the RMS current through the given via in the V_1st layer, and helps fortify against EM as a result. In some embodiments, as capacitance increases, so does RMS current.

Regarding FIG. 2B, semiconductor device 230 includes substrate 206; first and second active regions 228 and 232 on substrate 206; first 234 and second 236 sets of gate structures which correspondingly partially overlap first and second active regions 228 and 232; first conductive structure 210 which overlaps first active region 228; second conductive structure 212 which partially overlaps second active region 232; and third conductive structure 214 which partially overlaps first conductive structure 210 and second conductive structure 212.

In FIG. 2B, first set of gate structures 234 are electrically coupled to first conductive structure 210 through VG structures 240. In some embodiments, VG structures 240 are electrically coupled to an upper portion of one or more gate structures 244(1)-244(4) in set 234. In some embodiments, second set of gate structures 236 are electrically coupled to second conductive structure 212 through VG structures 241 that are electrically coupled to upper portion of one or more gate structures 244(5)-244(8) of set 236.

Again, FIG. 2C is an offset cross-sectional view of the semiconductor device of FIG. 2B, in accordance with some embodiments. The sectional view line which FIG. 2C represents is shown in FIG. 2B as sectional view line IIC.

In FIG. 2C, which again is an offset cross-sectional view, first conductive structure 210 is electrically coupled to third conductive structure 214 through via 218. In some embodiments, second conductive structure 212 is electrically coupled to third conductive structure 214 through via 219. In some embodiments, third conductive structure 214 in M_$2^{nd}$ layer 216 is electrically coupled to via 221 that electrically couples conductive structure 214 with a conductive structure 238 in M_$3^{rd}$ layer 239, where via 221 is in a second layer of interconnection (V_2nd layer) (237 FIG. 2C).

FIGS. 2D, 2E, 2F, and 2G are corresponding layout diagrams of variations of semiconductor device 230 with current-distributing input pin structure 204, in accordance with some embodiments.

Figure 2D:
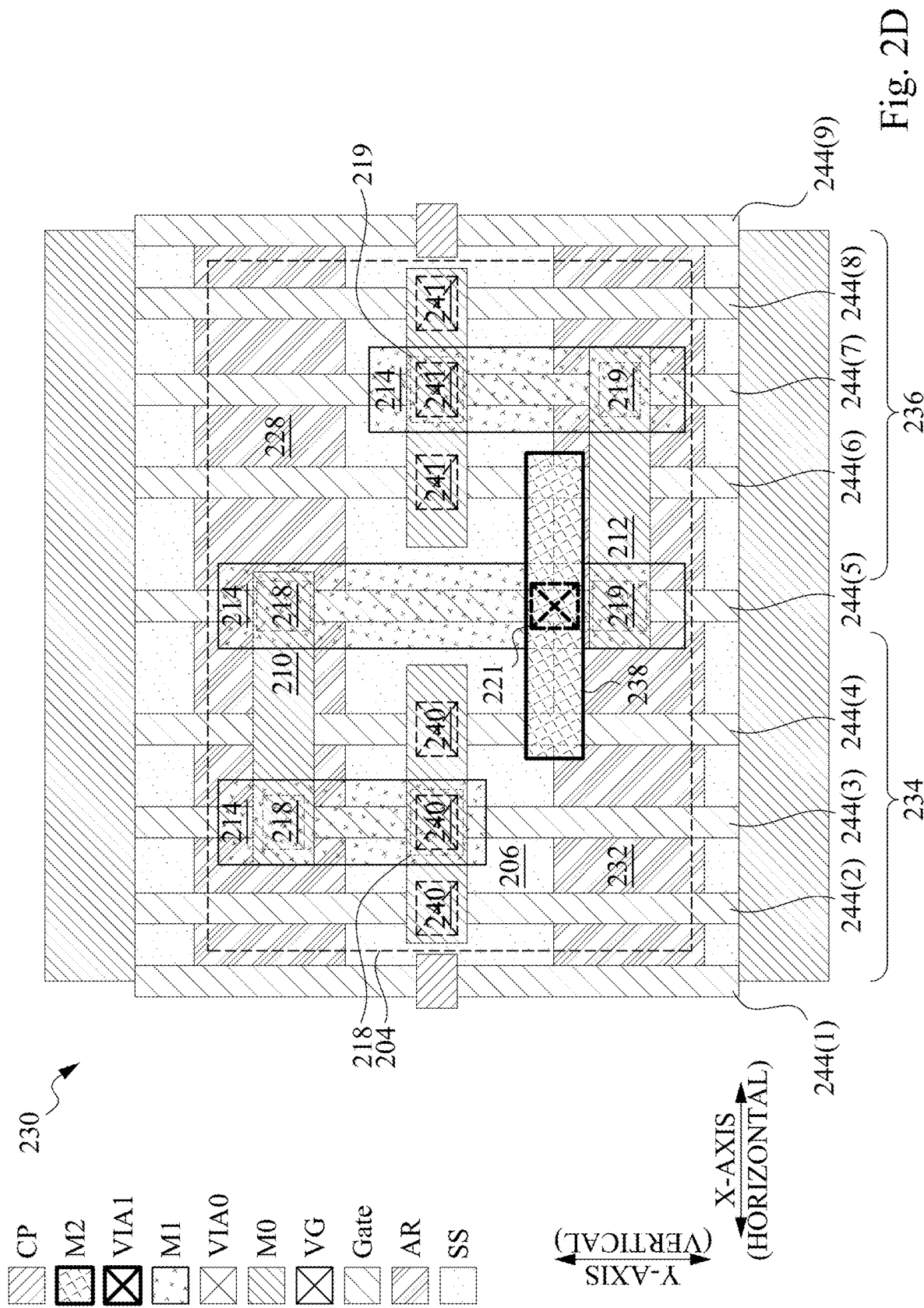
FIG. 2D is a layout drawing of a semiconductor device, in accordance with some embodiments.
Figure 2E:
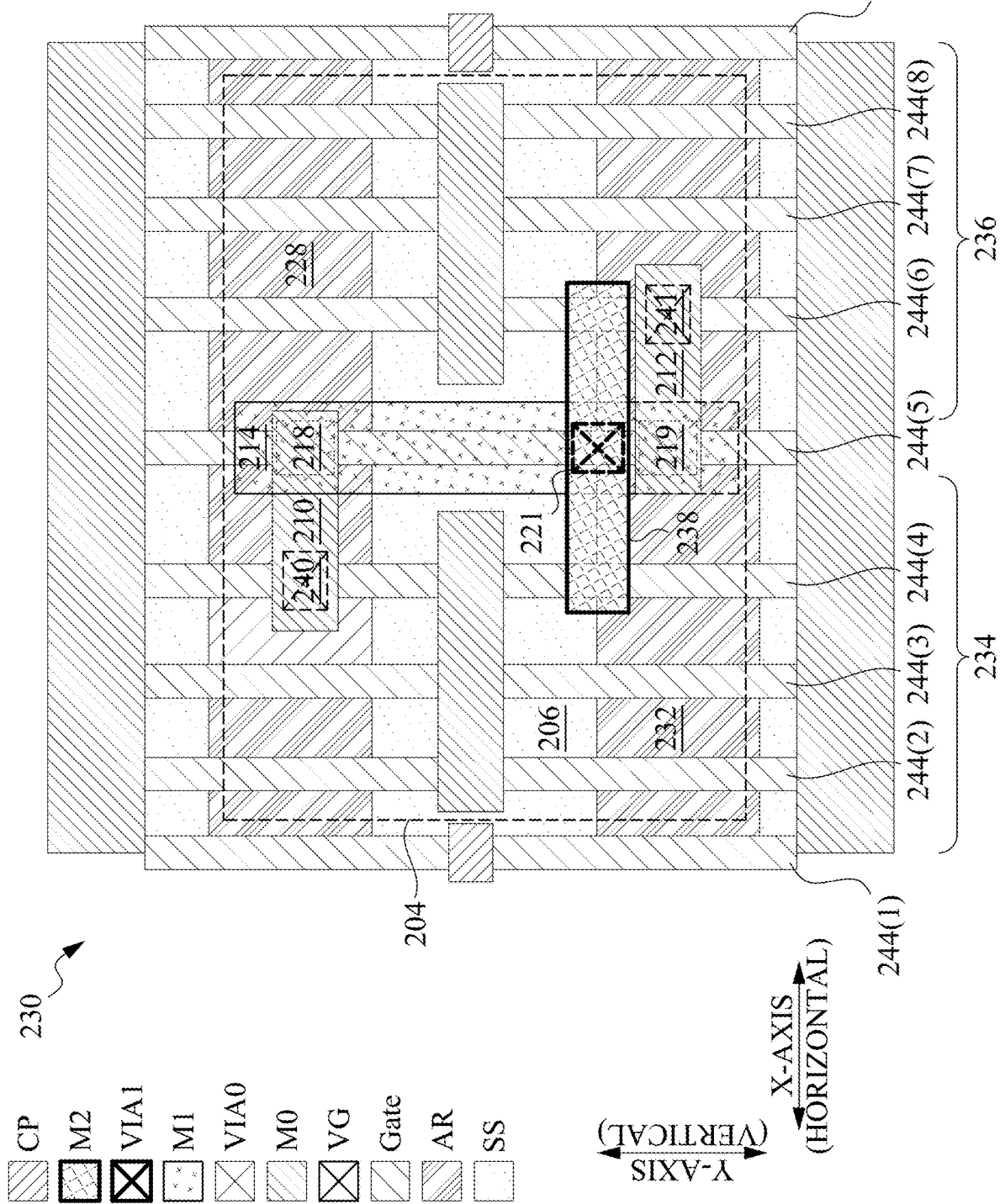
FIG. 2E is a layout drawing of a semiconductor device, in accordance with some embodiments.
Figure 2F:
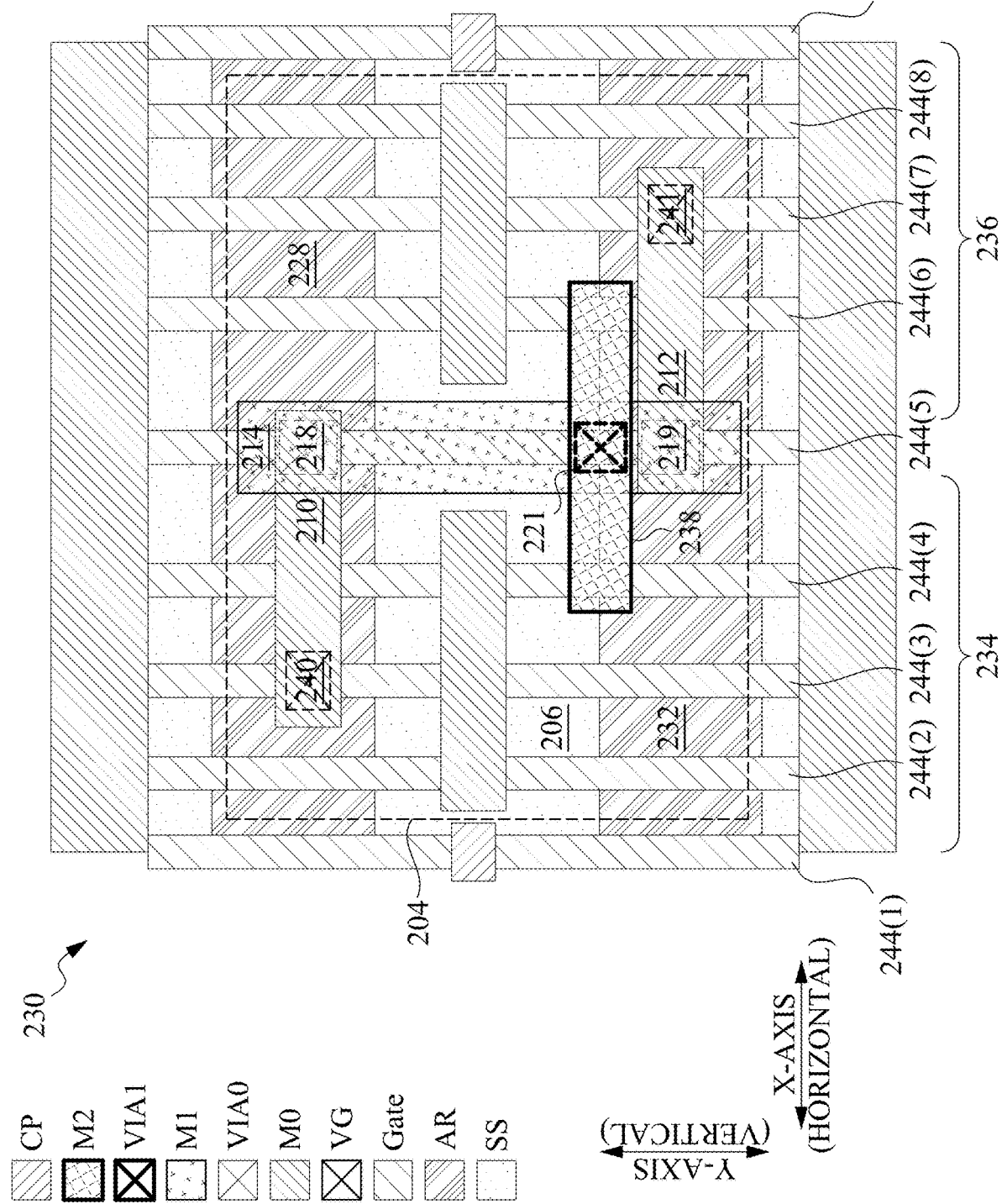
FIG. 2F is a layout drawing of a semiconductor device, in accordance with some embodiments.
Figure 2G:
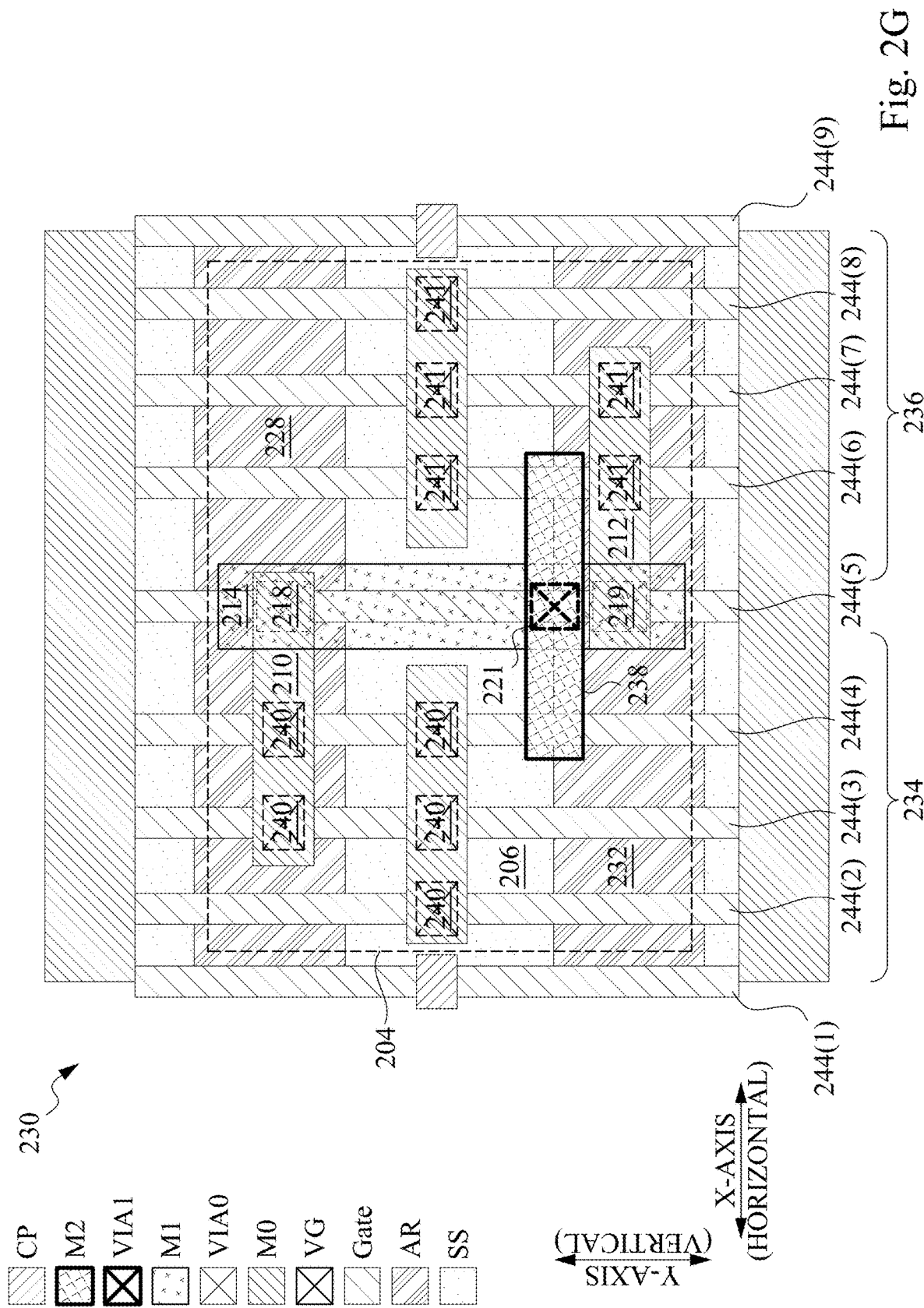
FIG. 2G is a layout drawing of a semiconductor device, in accordance with some embodiments.

In some embodiments, such as shown in FIG. 2D first conductive structure 210 and second conductive structure 212 in M_$1^{st}$ layer 208 are electrically coupled to one or more gate structures through additional M_$1^{st}$ layers set between active regions 228 and 232. In some embodiments, such as shown in FIGS. 2D-2G, first and second conductive structures 210, 212 are shortened (relative to the X-axis in FIG. 2B) and extend over three (e.g., FIGS. 2D, 2F, and 2G) or fewer gate structures (e.g., FIG. 2E). In each of FIGS. 2D, 2F and 2G, conductive structure 210 overlaps gate structures 244(3)-244(5), and conductive structure 212 overlaps gate structures 244(5)-244(7). In FIG. 2E, conductive structure 210 overlaps gate structures 244(4)-244(5), and conductive structure 212 overlaps gate structures 244(5)-244(6). In FIGS. 2D-2G, first set of gate structures 234 and/or second set of gate structures 236 are electrically coupled by additional conductive structures, in M_$1^{st}$ layer 208, located between active region 228 and 232. In FIGS. 2D-2G, these additional conductive structures are not coupled to conductive structure 214 within M_$2^{nd}$ layer 216, but instead are coupled to first conductive structure 210 and/or second conductive structure 212 within M_$1^{st}$ layer 208 through a commonly connected gate structure, such as in FIGS. 2E-2G. In some embodiments, the additional conductive structures within M_$1^{st}$ layer 208 are electrically coupled to an additional conductive structure within M_$2^{nd}$ layer 216 instead of a commonly electrically coupled gate, such as in FIG. 2D. That is, additional conductive structures in M_$2^{nd}$ layer 216 are used to electrically couple additional conductive structures within M_$1^{st}$ layer 208 that are also electrically coupled to first conductive structures 210 and second conductive structure 212 within M_$1^{st}$ layer 208.

Figure 3A:
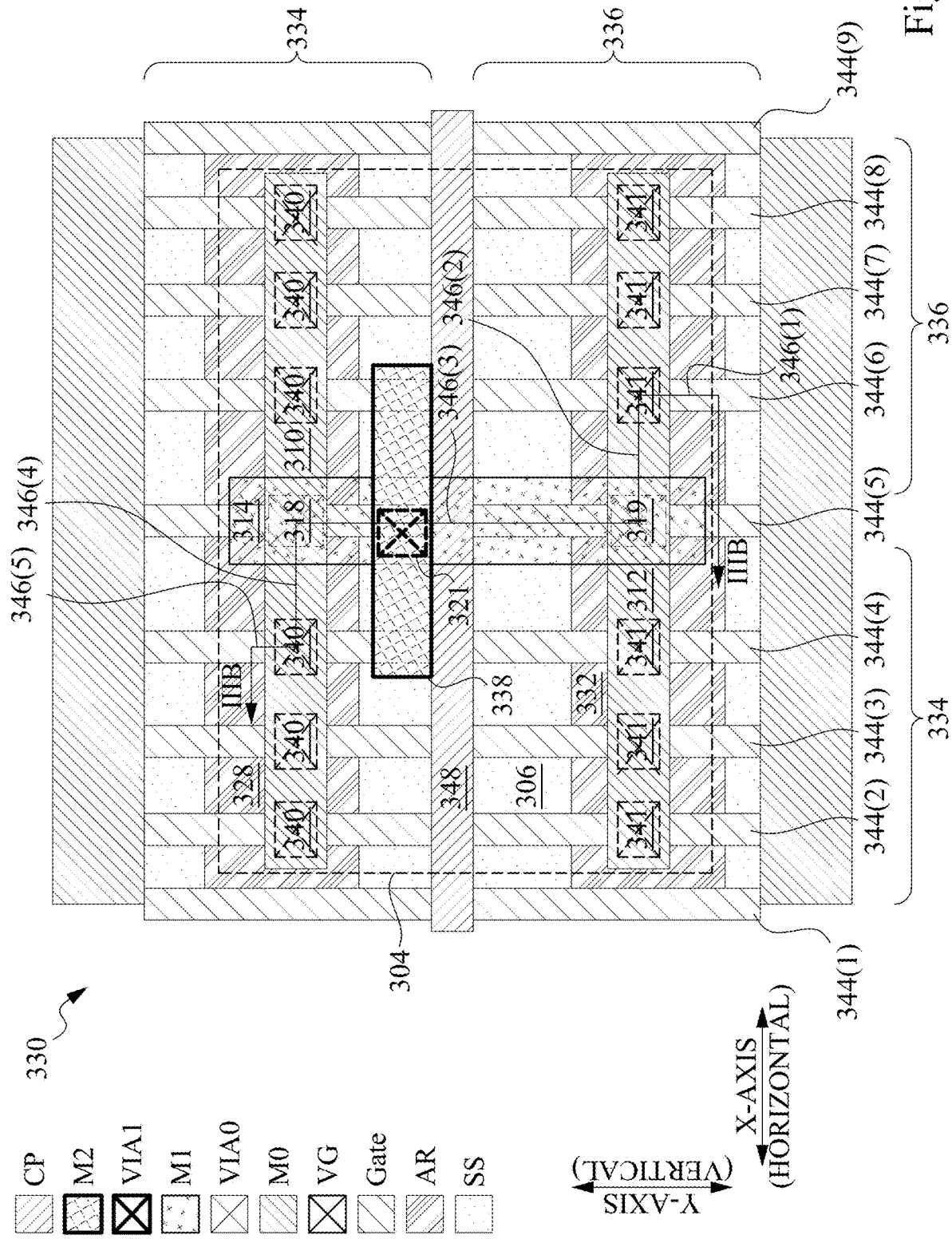
FIG. 3A is a layout drawing of a semiconductor device, in accordance with some embodiments.

FIG. 3A is a layout drawing of a semiconductor device 330, in accordance with some embodiments.

In some embodiments, FIG. 3A differs from FIG. 2B in that semiconductor device 330 reduces RMS current, by approximately 50%, by splitting gate structures 344(1), 344(2), 344(3), 344(4), 344(5), 344(6), 344(7), 344(8) and 344(9) along a horizontal direction using cut pattern 348 to control which portions of gate structures 344(2)-344(8) are served by access point 318 and which portions of gate structures 344(2)-344(8) are served by access point 319. Whereas the entirety of each of gate structures 244(2)-244(4) is served by access point 218 and the entirety of each of gate structures 244(5)-244(7) is served by access point 219 in FIG. 2B, by contrast the upper portions of gate structures 344(2)-344(8) are served by access point 318 and the lower portions of gate structures are 344(2)-344(8) are served by access point 319 in FIG. 3B.

The layout diagram of FIG. 3A is like the layout diagram of FIG. 2B. FIG. 3A follows a like numbering convention to that of FIG. 2B. Though corresponding, some components also differ. To help identify components which correspond but nevertheless have differences, FIG. 3A uses 3-series numbering whereas FIG. 2B uses 2-series numbering. For brevity, the discussion will focus more on differences between FIG. 2B and FIG. 3A than on similarities.

The layout diagrams of FIG. 3A is representative of a structure in a semiconductor device. In FIG. 3A, structures in the semiconductor device are represented by shapes (also known as patterns) in the layout diagram. For simplicity of discussion, elements in the layout diagrams of FIG. 3A (and of other figures included herein) will be referred to as if they are structures rather than shapes per se. For example, shape 328 in FIG. 3A represents active region 328 in FIG. 3B (also known as an oxide-dimensioned (OD) region); in the following discussion, element 328 is referred to as active region 328.

In some embodiments, semiconductor device 330 is among one or more semiconductor devices included in IC 100. In some embodiments, semiconductor device 330 includes current-distributing input pin structure 304 that is used in IC 100 in region 102, and that includes a conductive segment with a greater number of access points and correspondingly smaller current being passed through the access points to fortify against EM degradation.

In some embodiments, an IC, such as IC 100, includes a substrate 306; first and second active regions 328, 332 that correspondingly extend in a first direction (along X-axis) on substrate 306, second active region 332 being separated from first active region 328 in a second direction (along Y-axis) substantially perpendicular to the first direction.

Figure 3B:
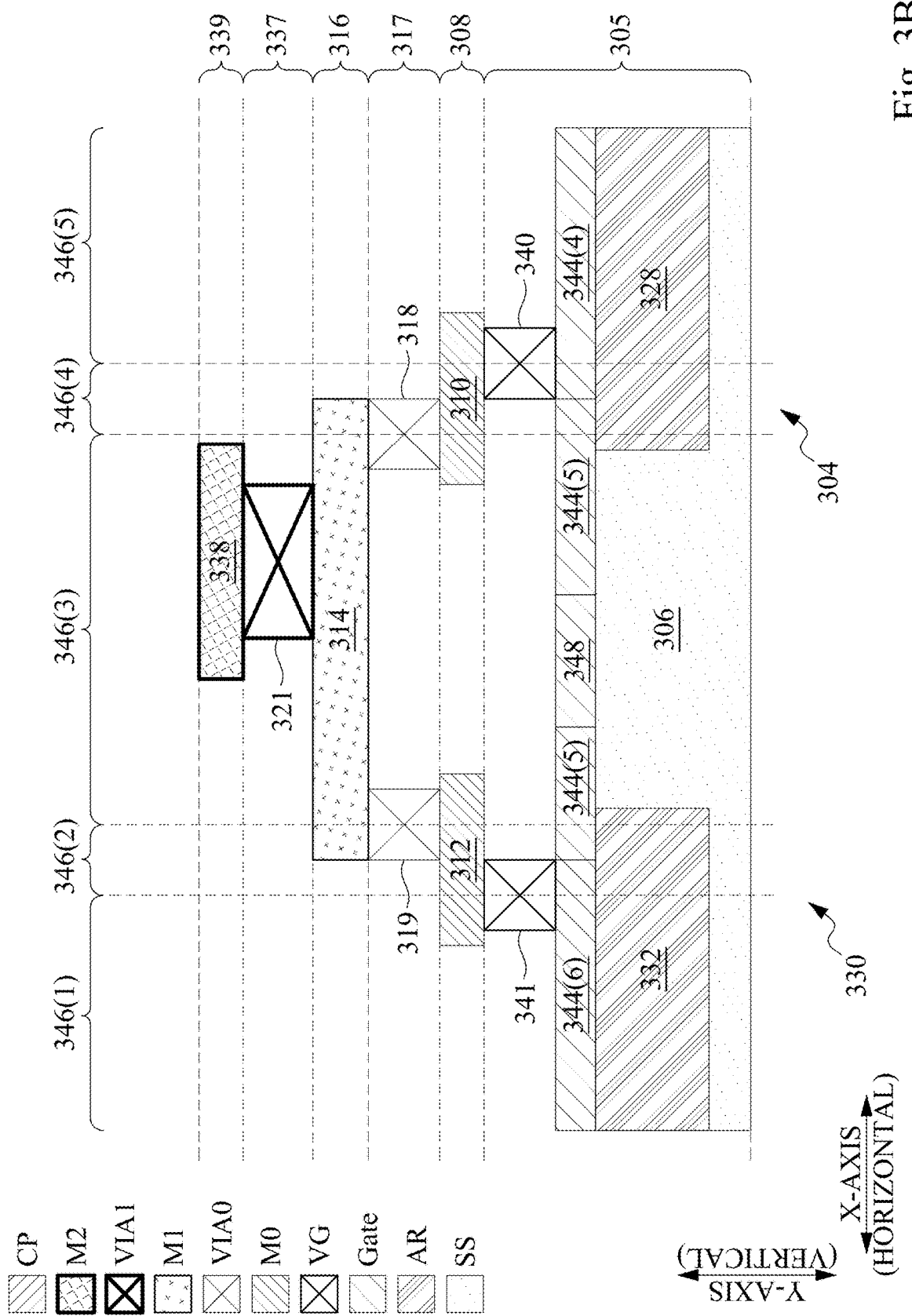
FIG. 3B is an offset cross-sectional view of a semiconductor device, in accordance with some embodiments.

First and second sets of gate structures 334, 336 extending in the second direction where first set of gate structures 334 correspondingly overlap first active region 328 and second set of gate structures 336 correspondingly overlap second active region, 332. First conductive structure 310 within $M\_1^{st}$ layer (308 FIG. 3B) extends in the first direction, overlaps first active region 328, and overlaps and is electrically coupled to first set of gate structures 334 that includes each of gate structures 344(2), 344(3), 344(4), 344(5), 344(6), 344(7) and 344(8). Second conductive structure 312 within M_1st layer 308 extends in the first direction, overlaps second active region 332, and overlaps and is electrically coupled to second set of gate structures 336 that includes gate structures 344(2), 344(3), 344(4), 344(5), 344(6), 344(7) and 344(8). Third conductive structure 314 within $M\_2^{nd}$ layer 316 extends in the second direction is electrically coupled to first conductive structure 310 and second conductive structure 312 through via structures 318 and 319 within a first layer of interconnection (V_1st layer) (see 317 FIG. 3B). In some embodiments, third conductive structure 314 in $M\_2^{nd}$ layer 316 is electrically coupled to via 321 that electrically couples conductive structure 314 with a conductive structure 338 in $M\_3^{rd}$ layer 339, where via 321 is in a second layer of interconnection (V_2 nd layer) (337 FIG. 3B). Vias 318 and 319 are in a first layer of interconnection (V_1st layer) (see 317 FIG. 3B). In FIG. 3B, transistor layer 305 includes substrate 306, active regions 328 and 332, gate structures 344(4), 344(5) and 344(6) and via-to-gate (VG) structures 340 and 341.

FIG. 3B is an offset cross-sectional view of a semiconductor device 330, in accordance with some embodiments.

The sectional view line which FIG. 3B represents is shown in FIG. 3A as offset sectional view line IIIB. Portions 346(1), 346(2), 346(3), 346(4) and 346(5) of line IIIB in FIG. 3B correspond to like-numbered segments of line IIIB in FIG. 3A.

In some embodiments, M0 is the first layer of metallization above a transistor layer 305. Transistor layer 305 includes substrate 306, active regions 328 and 332, gate structures 334 and 336 and via-to-gate (VG) structures 340 and 341. In some embodiments, depending upon the numbering convention of the corresponding process node by which such a semiconductor device is fabricated, M_1st layer 308 is either metallization layer zero, M0, or metallization layer one, M1, and correspondingly the V_1st layer is either VIA0 or VIA1. In some embodiments, M0 is the first layer of metallization above a transistor layer 305. Vias 318 and 319 are in a first layer of interconnection (V_1st layer) 317. In some embodiments, third conductive structure 314 in $M\_2^{nd}$ layer 316 is electrically coupled to via 321 that electrically couples conductive structure 314 with a conductive structure 338 in $M\_3^{rd}$ layer 339, where via 321 is in a second layer of interconnection 337.

In some embodiments, first set of gate structures 334 are electrically coupled to first conductive structure 310 within $M\_1^{st}$ layer 308 through via structures 340. In some embodiments, second set of gate structures 336 are electrically coupled to second conductive structure 312 within $M\_1^{st}$ layer 308 through via structures 341 that are electrically coupled to second set of gate structures 336. In some embodiments, gate structures 344(1)-344(8) are overlapped by a cut pattern 348 which represents an electrical separation of an integral predecessor gate structure into multiple gate structures. In FIG. 3A, cut pattern 348 overlaps each of gate structures 344(1)-344(8), which indicates that each of gate structures 344(1)-344(8) has a corresponding upper portion which is electrically isolated from a corresponding lower portion. In some embodiments, cut pattern 348 represents gaps separating the upper and lower portions of corresponding gate structures 344(1)-344(8). In some embodiments, the gaps represented by cut pattern 348 are filled with a dielectric material, the dielectric material representing an electrical discontinuity between corresponding upper and lower portions.

In some embodiments, first conductive structure 310 within $M\_1^{st}$ layer 308 is electrically coupled to third conductive structure 314 within $M\_2^{nd}$ layer 316 through via structure 318 within a first layer of interconnection (V_1st layer) 317. In some embodiments, second conductive structure 312 within $M\_1^{st}$ layer 308 is electrically coupled to third conductive structure 314 within $M\_2^{nd}$ layer 316 through via structure 319 within V_1st layer 317 that is electrically coupled second conductive structure 312.

In contrast to semiconductor device 230 that reduces the semiconductor device current by vertically separating the gate structures into first set of gate structures 234 and second set of gate structures 236, semiconductor device 330 reduces the semiconductor device current by horizontally separating the gate structures into first set of gate structures 334 and second set of gate structures 336. In some embodiments, the reduction of RMS current at access points 218 and 219 in semiconductor device 230 is roughly the same as the RMS current reduction at access points 318 and 319; reduced by half.

In comparison with the cross-type pin of the other approach in which the current through a single conductive structure in the $M\_1^{st}$ layer is cumulative at one access point, in some embodiments, currents provided to first conductive structure 310 are separated by cut pattern 348 from currents provided to second conductive structure 312. In some embodiments, the RMS current is effectively reduced by half correspondingly at vias 318 and 319.

In FIGS. 3C, 3D, 3E, 3F and 3G semiconductor device 330 with current-distributing input pin structure 304 are represented in accordance with some embodiments.

Figure 3C:
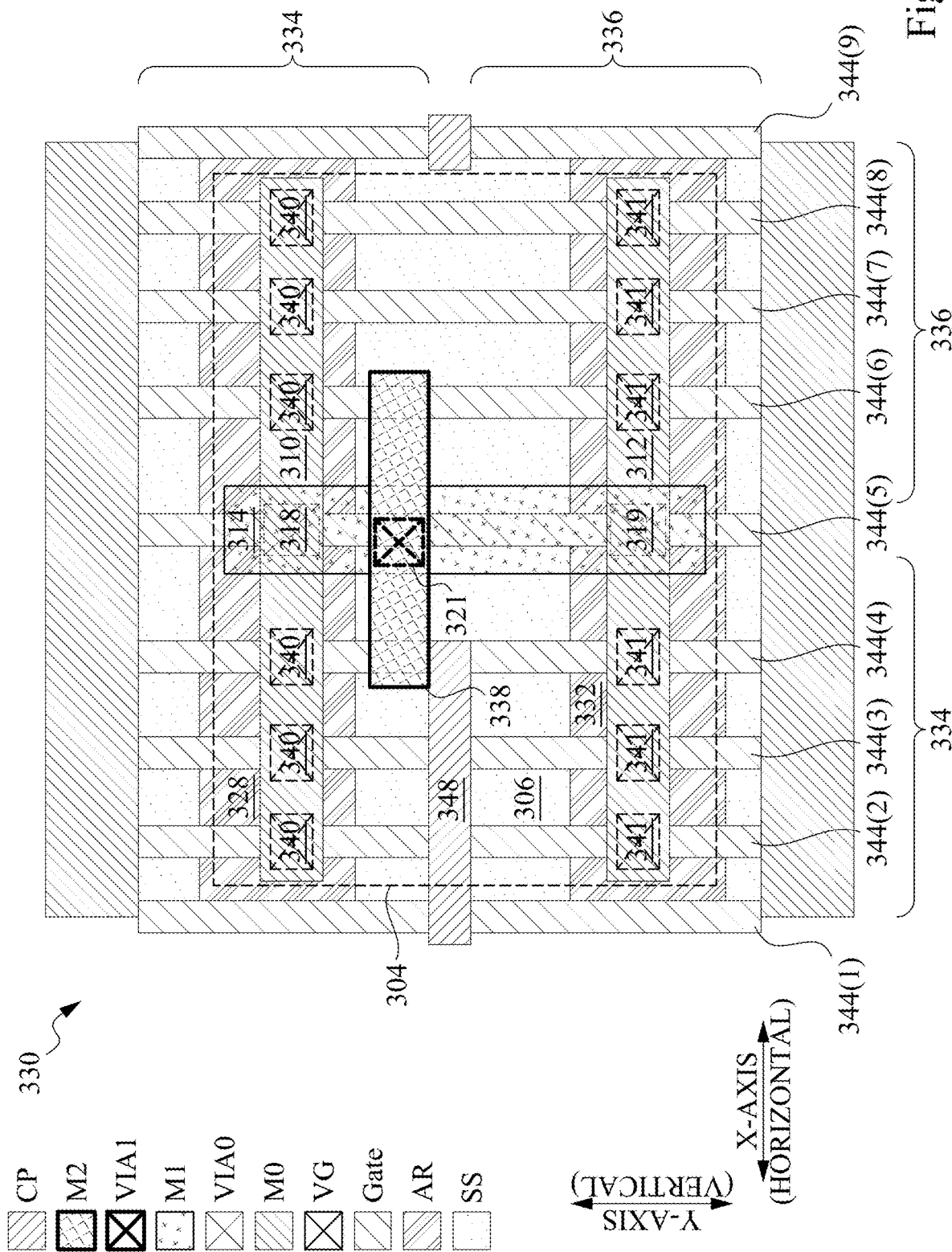
FIG. 3C is a layout drawing of a semiconductor device, in accordance with some embodiments.
Figure 3D:
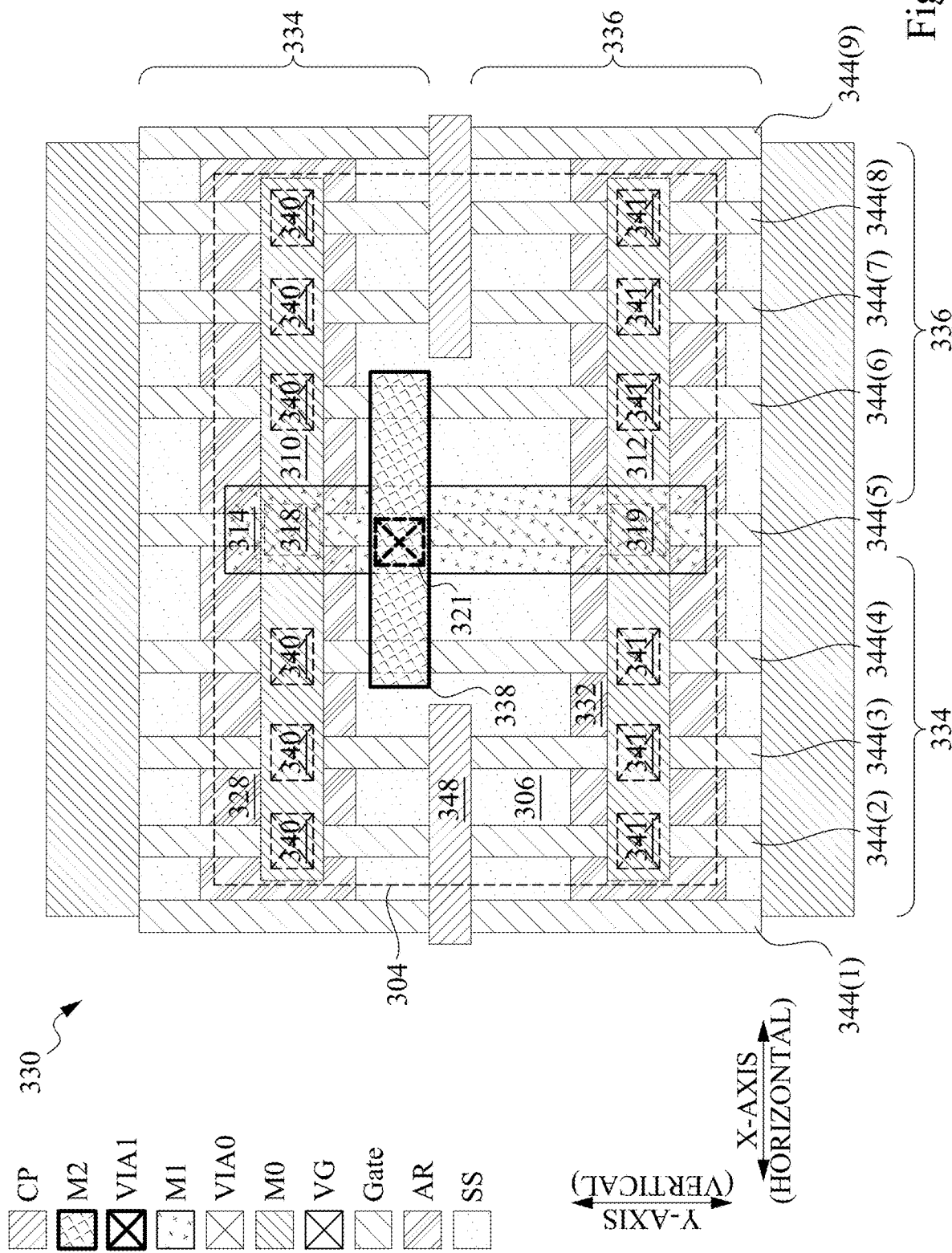
FIG. 3D is a layout drawing of a semiconductor device, in accordance with some embodiments.
Figure 3E:
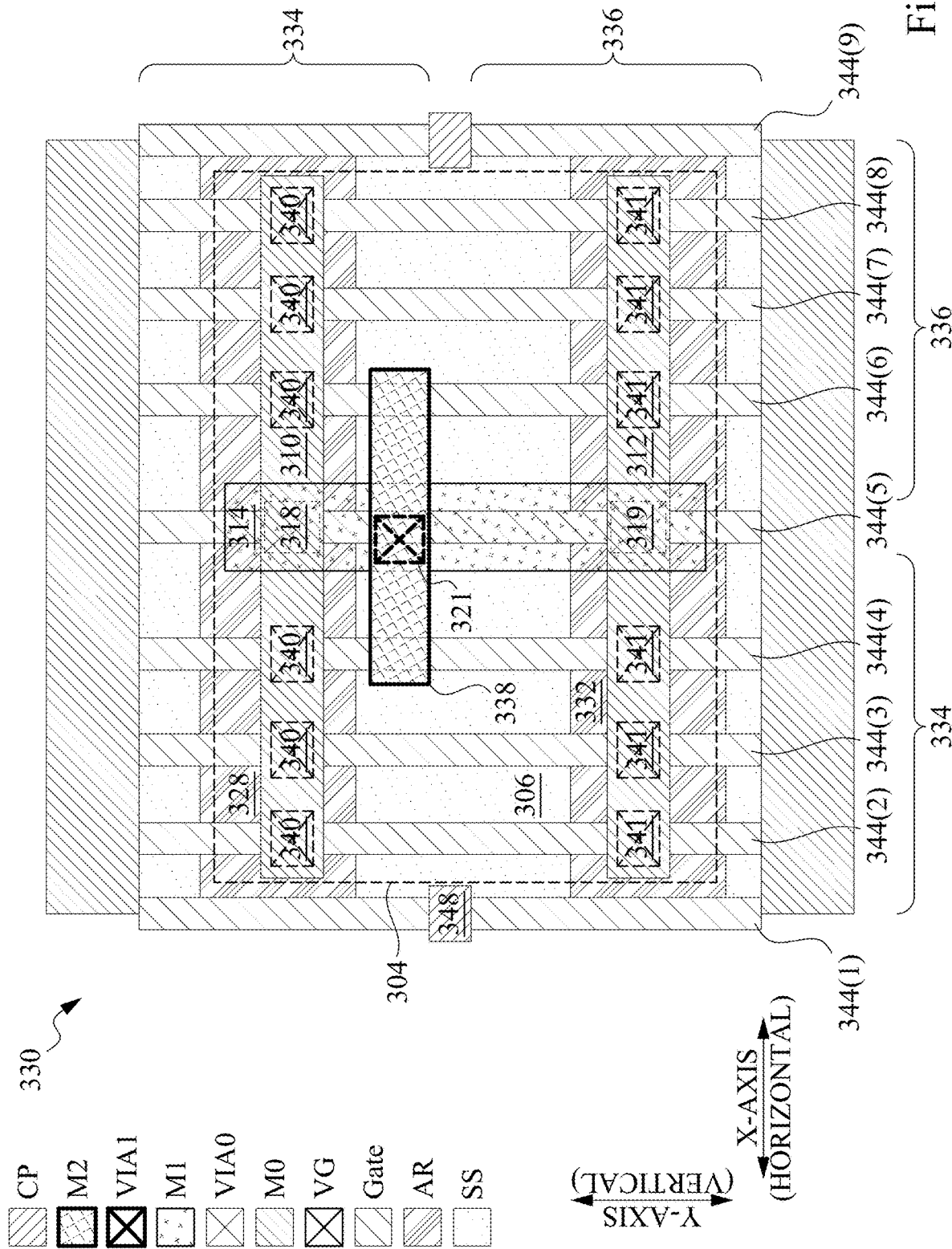
FIG. 3E is a layout drawing of a semiconductor device, in accordance with some embodiments.
Figure 3F:
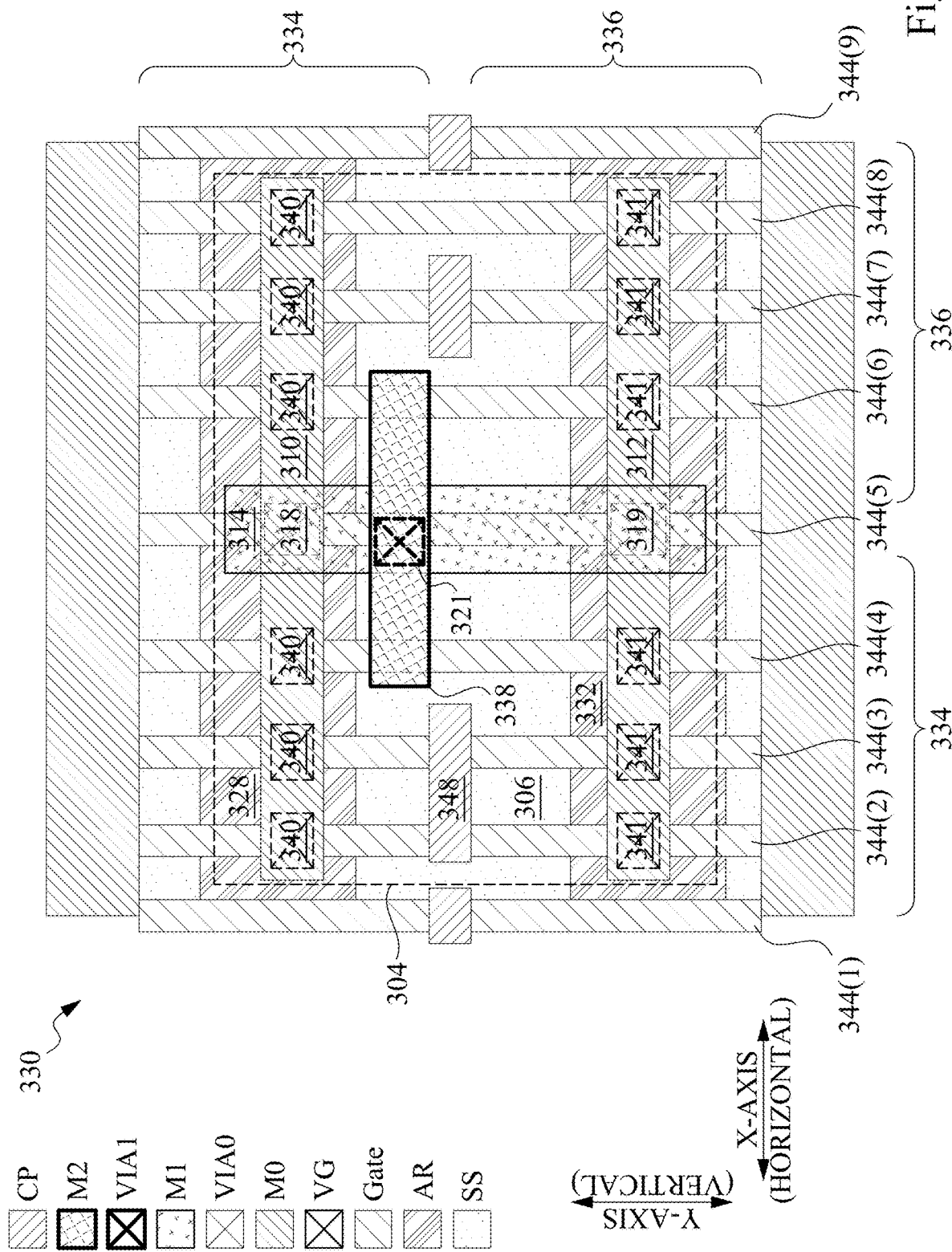
FIG. 3F is a layout drawing of a semiconductor device, in accordance with some embodiments.
Figure 3G:
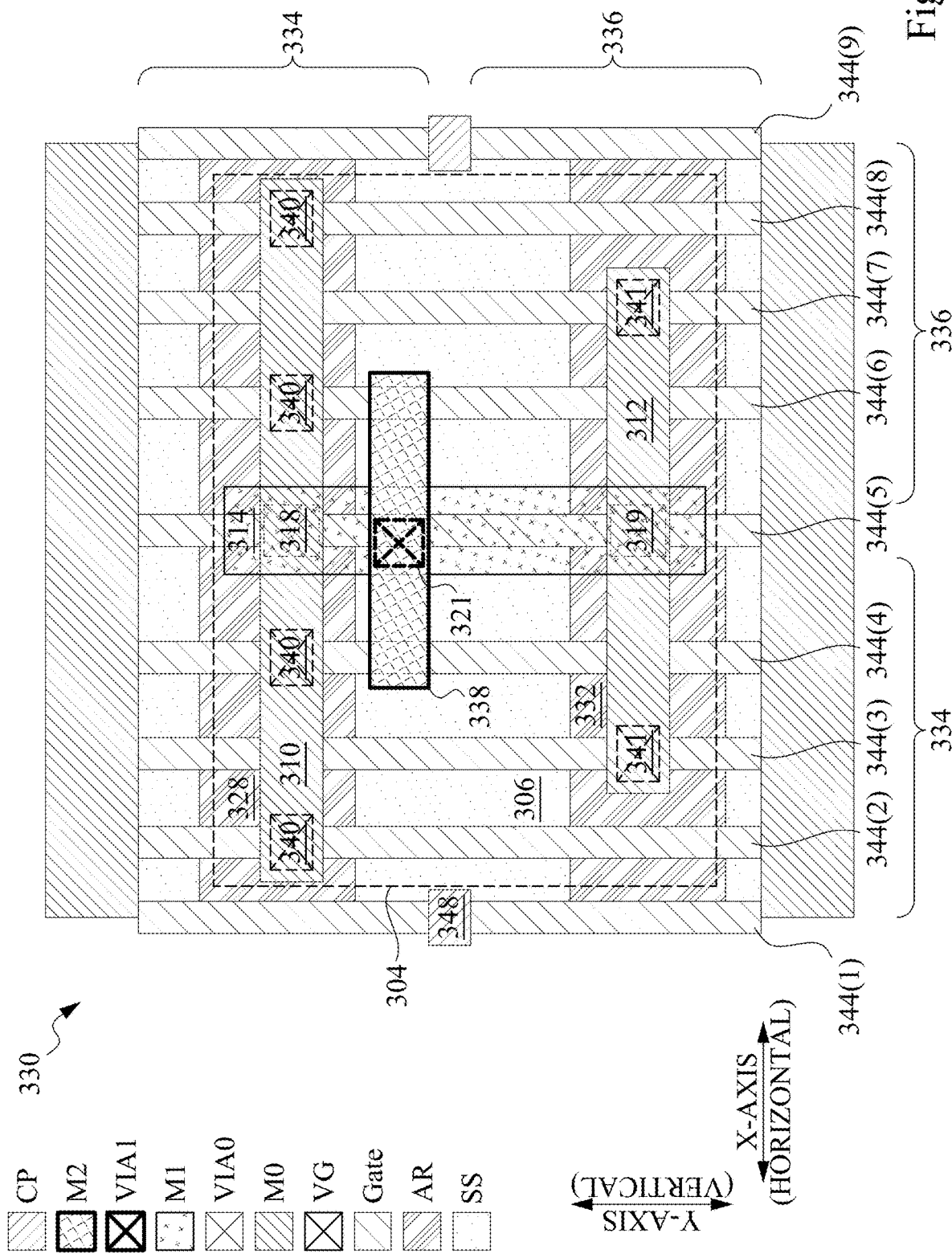
FIG. 3G is a layout drawing of a semiconductor device, in accordance with some embodiments.

In FIG. 3C, a portion of cut pattern 348 extends across left side of input pin structure 304 without a corresponding portion of cut pattern extending across right side of input pin structure 304. More particularly, in FIG. 3C, cut pattern 348 includes two parts which collectively overlap gate structures 344(1)-344(4) and 344(9). In some embodiments, a portion of cut pattern 348 extends across right side of input pin structure 304 without a corresponding portion of cut pattern extending across left side of input pin structure 304. In FIGS. 3D and 3F, cut pattern 348 extends over a first subset (i.e., less than all) of the gate structures on left side of input pin structure 304 and a second subset (i.e., less than all) of the gate structures on right side of input pin structure 304. More particularly, in FIG. 3D, cut pattern 348 includes two parts which collectively overlap gate structures 344(1)-344(3) and 344(7)-344(9). In each of FIGS. 3E and 3G, cut pattern 348 includes two parts which collectively overlap gate structures 344(1) and 344(9). In some embodiments, the number of gaps in gate structures resulting from cut pattern 348 is selected based upon an amount of reduced current at access points 318 and 319 that is to be achieved. In FIGS. 3E and 3G, cut pattern 348 does not overlap active gate structures, namely gate structures 344(2)-344(8). In some embodiments, the gate structures alternate between being electrically coupled to first conductive structure 310 or second conductive structure 312, e.g., as in FIG. 3G. In some embodiments, relative to the X-axis on FIG. 3A, first conductive structure 310 or second conductive structure 312 is shortened in length and is coupled to one or more gate structures closest to third conductive structure 314, e.g., second conductive structure 312 in FIG. 3G.

FIGS. 4A and 4B are corresponding layout diagrams. FIG. 4A is a partial layout diagram of a current-distributing input pin structure 404, in accordance with some embodiments. FIG. 4A is a simplified version of FIG. 4B. FIG. 4C is an offset cross-sectional view of a semiconductor device 430, in accordance with some embodiments. The layout diagrams of FIG. 4A is like the layout diagram of FIG. 2A. The layout diagrams of FIGS. 4B and 4C are like the layout diagrams of FIGS. 2A, 2C and 3B. FIG. 4B follows a like numbering convention to that of FIGS. 2B and 3A. Though corresponding, some components also differ. To help identify components which correspond but nevertheless have differences, FIG. 4A uses 4-series numbering whereas FIG. 2B uses 2-series numbering and FIG. 3A uses 3-series numbering. For brevity, the discussion will focus more on differences between FIG. 2B and FIG. 4A than on similarities.

In some embodiments, current-distributing input pin structure 404 is used in IC 100 in region 102 that includes a conductive segment with a greater number of access points and correspondingly smaller currents being passed through the access point to fortify against EM degradation. In some embodiments, current-distributing input pin structure 404 is like current-distributing input pin structure 204 in that each operates to lower current, RMS current, and current density at access points located on an input pin.

In some embodiments, semiconductor device 430 (FIG. 4B), includes a substrate 406 (FIGS. 4B & 4C) that includes first and second active regions (428, 432, FIGS. 4B & 4C) that correspondingly extend in a first direction (along the X-axis) on substrate 406. In some embodiments, second active region (432 FIGS. 4B & 4C) is separated from first active region (428 FIGS. 4B & 4C) in a second direction (along the Y-axis) substantially perpendicular to the first direction. Semiconductor device 430 further includes gate structures 444(1), 444(2), 444(3), 444(4), 444(5), 444(6), 444(7), 444(8) and 444(9). The gate structures are organized into a first set that includes upper portion of gate structures 444(1)-444(5), second set that includes lower portions of gate structures 444(1)-444(5), and third set that includes gate structures 444(6)-444(9). First, second, and third sets of gate structures (434, 435, and 436, FIG. 4B) extend in the second direction. In some embodiments, the first, and third sets of gate structures (434, 436, FIG. 4B) correspondingly overlap first active region (428 FIG. 4B). In some embodiments, the second and third sets of gate structures (435, 436, FIG. 4B) correspondingly overlap second active region (432 FIG. 4B). In some embodiments, a first conductive structure 410 within an M_1$^{st}$ layer 408 (FIG. 4C) extends in the first direction, at least partially overlaps first active region (428 FIGS. 4B & 4C), and is electrically coupled to first set of gate structures (434 FIG. 4B). In some embodiments, a second conductive structure 412 within M_1st layer 408 (FIG. 4C) extends in the first direction, at least partially overlaps second active region (432 FIGS. 4B & 4C), and is electrically coupled to second set of gate structures (435 FIG. 4B). In some embodiments, a third conductive structure 411 (corresponding to a block 445) within M_1st layer 408 (FIG. 4C) extends in the first direction between first and second active regions (428, 432 FIGS. 4B & 4C), and is electrically coupled to third set of gate structures (436 FIG. 4B). Relative the Y-axis, third conductive structure 411 is between the first and second active regions, i.e., does not overlap the first and second active regions. In some embodiments, a fourth conductive structure 414 within M_2 nd layer 416 (FIG. 4C) extends in the second direction. Fourth conductive structure 414 is electrically coupled to, and at least partially overlaps, first conductive structure 410, second conductive structure 412, and third conductive structure 411 through corresponding vias 418, 417, and 419. Vias 418, 415 and 419 are in a first layer of interconnection (V_1st layer) (see 415 FIG. 4C). In some embodiments, depending upon the numbering convention of the corresponding process node by which such a semiconductor device is fabricated, M_1st layer 408 is either metallization layer zero, M0, or metallization layer one, M1, and correspondingly the V_1st layer is either VIA0 or VIA1. In some embodiments, M0 is the first layer of metallization above a transistor layer (see 405 FIG. 4C). In FIG. 4C, transistor layer 405 includes substrate 406, active regions 428 and 432, gate structures 444(5), 444(6) (corresponding to a block 442) and via-to-gate (VG) structures 440 and 441.

In some embodiments, current through first conductive structure 410 is represented by arrows 420A and 420B. In some embodiments, current 420A and 420B are currents conducted to first conductive structure 410 through one or more gate structures of the first set (434 FIG. 4B). In some embodiments, currents 420A, 420B are currents from left-upper side 422 of current-distributing input pin structure 404 where the first set of gates structures (434 FIG. 4B) is located.

In some embodiments, current through second conductive structure 412 is represented by arrows 420C and 420D. In some embodiments, currents 420C and 420D are currents conducted to second conductive structure 412 through one or more gate structures in the second set (435 FIG. 4B). In some embodiments, currents 420C, 420D are currents from left-lower side 423 of current-distributing input pin structure 404 where the second set of gate structures (435 FIG. 4B) is located.

In some embodiments, current through third conductive structure 411 is represented by arrows 420E and 420F. In some embodiments, currents 420E and 420F are currents conducted to third conductive structure 411 through one or more gate structures in the third set (436 FIG. 2B). In some embodiments, currents 420E, 420F are currents from right side 424 of current-distributing input pin structure 404 where the third set of gate structures (436 FIG. 2B) is located.

In some embodiments, currents 420A, 420B are conducted to fourth conductive structure 414 through via 418 that electrically couples first conductive structure 410 to fourth conductive structure 414. In some embodiments, currents 420C, 420D are conducted to fourth conductive structure 414 through via 419 that electrically couples second conductive structure 412 to fourth conductive structure 414. In some embodiments, currents 420E, 420F are conducted to fourth conductive structure 414 through via 417 that electrically couples third conductive structure 411 to fourth conductive structure 414. In some embodiments, currents 420A, 420B, 420C, 420D, 420E, and 420F are combined and conducted through via 421 that electrically couples fourth conductive structure 414 with a conductive structure (438 FIGS. 4B-4C) within an M_3$^{rd}$ layer (443 FIG. 4C).

In comparison with the cross-type pin according to the other approach in which the current through a single conductive structure in the M_1$^{st}$ layer is cumulative at one access point, in some embodiments, each of (1) currents 420A and 420B provided to first conductive structure 410, (2) currents 420C and 420D provided to second conductive structure 412, and (3) currents 420E and 420F provided to third conductive structure 411 are separated from each other by corresponding vias 418, 419 and 417. In FIGS. 4A-2C, incorporating three access points, such as vias 418, 417 and 419, for fourth conductive structure 414 effectively reduces the RMS current by ⅔ at each access point as compared to the single access point of the cross-type pin according to the other approach.

In some embodiments, the capacitances of the VG structures (439, 440, 441 FIGS. 4B & 4C) is represented figuratively by capacitors 426A, 426B (not shown in FIG. 4A), 426C, 426D, 426E (not shown in FIG. 4A), 426F, 426G, 426H (not shown in FIG. 4A) and 426I. In some embodiments, the capacitances at the VG structures (439, 440, 441 FIGS. 4B & 4C) between one or more gate structures of the first set (434 FIG. 4B) and first conductive structure 410, one or more gate structures of the second set (435 FIG. 4B) and second conductive structure 412, one or more gate structures of the third set (436 FIG. 4B) and third conductive structure 411 is also reduced by being separated between first conductive structure 410, second conducive structure 412, and third conductive structure 411. By separating M_1$^{st}$ layer 408 into first conductive structure 410, second conductive structure 412, and third conductive structure 411, the capacitance of M_1$^{st}$ layer 408 is effectively cut in half between (1) third conductive structure 411 and (2) first and second conductive structures 410 and 412. In some embodiments, the capacitance of M_1$^{st}$ layer 408 is cut in half again between first and second conductive structures 410 and 412 as they are separated by cut pattern 448. With reference to equation (6) above, in some embodiments, as capacitance is lowered, the RMS current is directly reduced. This contrasts with the cross-type pin according to the other approach in which the capacitances of the conductive structures in the M_1$^{st}$ layer are not separated, which results in a level of RMS current that potentially induces EM degradation. In some embodiments, as capacitance increases, so does RMS current.

FIG. 4B is a layout diagram of a semiconductor device 430 with a current-distributing input pin structure 404, in accordance with some embodiments.

In some embodiments, semiconductor device 430 is one of many semiconductor devices used in IC 100. In some embodiments, semiconductor device 430 includes current-distributing input pin structure 404 that is used in IC 100 in region 102. Current-distributing input pin structure 404 includes a conductive segment with a greater number of access points and correspondingly smaller currents being passed through each of the access points, which fortifies against EM degradation. In some embodiments, current-distributing input pin structure 404 is like current-distributing input pin structure 204 in that each operates to lower current, RMS current, and current density at access points located on an input pin.

In some embodiments, semiconductor device 430 includes: substrate 406; first and second active regions 428, 432 on substrate 406; first, second, and third sets of gate structures 434, 435, and 436; first conductive structure 410 in M_1st layer 408; second conductive structure 412 in M_1st layer 408; third conductive structure 411 in M_1st layer 408; and fourth conductive structure 414 in M_2 nd layer 416.

FIG. 4C is an offset cross-sectional view of a semiconductor device 430 with a current-distributing pin structure 404, in accordance with some embodiments.

The sectional view line which FIG. 4C represents is shown in FIG. 4B as offset sectional view line IVC. Portions 446(1), 446(2), 446(3), 446(4), 446(5), 446(6), 446(7), 446(8) and 446(9)) of FIG. 4C correspond to like-numbered segments of line IVC in FIG. 4B.

In some embodiments, first set 434 of gate structures is electrically coupled to first conductive structure 410 within M_1$^{st}$ layer 408 through VG structure 439. In some embodiments, VG structure 439 is electrically coupled to one or more gate structures of set 434. In some embodiments, second set 435 of gate structures is electrically coupled to second conductive structure 412 through VG structure 440 that is electrically coupled to one or more gate structures of set 435. In some embodiments, third set 436 of gate structures is electrically coupled to third conductive structure 411 through VG structure 441 that is electrically coupled to one or more gate structures of set 436.

In some embodiments, first conductive structure 410 is electrically coupled to fourth conductive structure 414 through via structure 418. In some embodiments, second conductive structure 412 is electrically coupled to fourth conductive structure 414 through via structure 419. In some embodiments, third conductive structure 411 is electrically coupled to fourth conductive structure 414 through via 417.

In some embodiments, fourth conductive structure 414 in M_2$^{nd}$ layer 416 is electrically coupled to via 421 that electrically couples conductive structure 414 with a conductive structure 438 in M_3$^{rd}$ layer 443, where via 421 is in a second layer of interconnection (V_2nd layer) 437. Vias 418, 417 and 419 are in a first layer of interconnection (V_1st layer) 415.

Figure 5:
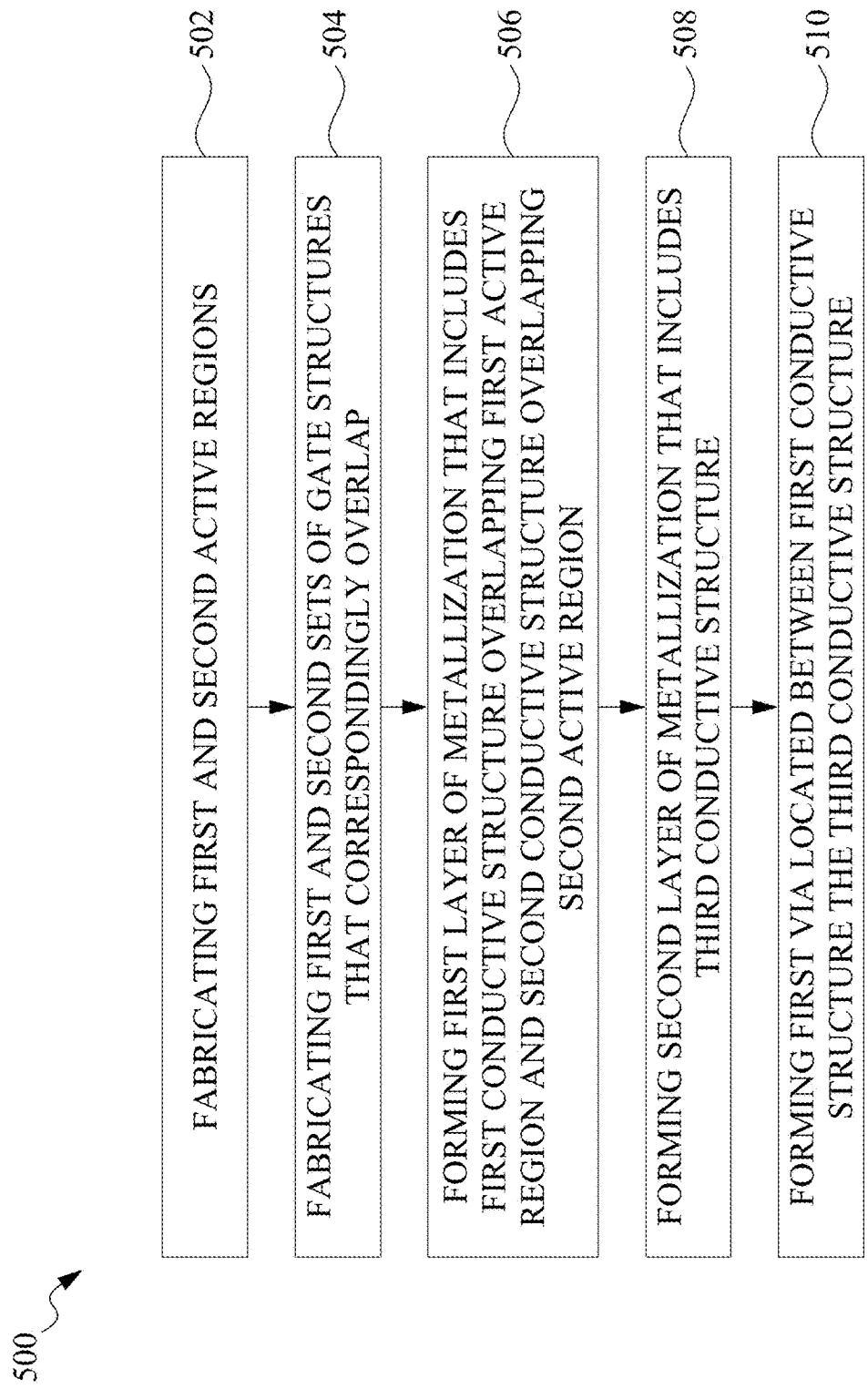
FIG. 5 is a flow diagram for a method of manufacturing a semiconductor device, in accordance with some embodiments.

FIG. 5 is a flowchart of a method of manufacturing a semiconductor device, in accordance with some embodiments.

In some embodiments, additional operations are performed before, during, and/or after method 500 depicted in FIG. 5, and that some other processes are only briefly described herein. Examples of semiconductor devices which are manufactured according to method 500 include semiconductor devices according to the layout diagrams of corresponding FIGS. 2B, 3A, and 4B, or the like.

FIG. 5 includes blocks 502, 504, 506, 508 and 510. At block 502 of method 500, first and second active regions that extend in a first direction on a substrate are fabricated. In addition, the second active region is separated from the first active region in a second direction substantially perpendicular to the first direction. As a non-limiting example, in the embodiments as shown in FIGS. 2B, 3A, and 4B, active regions 228, 232, 328, 332, 428 and 432 are fabricated atop or within the substrate. Continuing the example, first active regions 228, 328 and 428 extend in a first direction (along the X-axis). Second active regions 232, 332, and 432 also extend in the first direction, but are separated from first active regions 228, 328, and 428, perpendicularly in a second direction (along the Y-axis). From block 502, flow proceeds to block 504.

At block 504 of method 500, first and second sets of gate structures are fabricated extending in the second direction and overlapping the first and the second active regions. As a non-limiting example, in the embodiments as shown in FIGS. 2B, 3A, and 4B first set of gate structures 234, 334, and 434 extend in the second direction (along the Y-axis) and overlap the first active regions 228, 328, and 428. Continuing the example, second set of gate structures 236, 336, and 435 extend in the second direction and overlap the second active regions 232, 332, and 432. From block 504, flow proceeds to block 506.

At block 506 of method 500, a first layer of metallization is formed that includes a first conductive structure extending in the first direction and overlapping the first active region and a second conductive structure extending in the first direction overlapping the second active region. As a non-limiting example, in the embodiments as shown in FIGS. 2B, 3A, and 4B first layer of metallization 208, 308 and 408 includes a first conductive structure 210, 310, and 410 extending in the first direction (along the X-axis) and overlapping first active region 228, 328, and 428. Continuing the example first layer of metallization 203, 308 and 408 include second conductive structure 212, 312, and 412 extending in the first direction and overlapping second active region 232, 332, and 432. From block 506, flow proceeds to block 508.

At block 508 of method 500, a second layer of metallization that includes a third conductive structure is formed and extends in the second direction, at least partially, overlapping the first conductive structure and the second conductive structure. As a non-limiting example, in the embodiments as shown in FIGS. 2B, 3A, and 4B second layer of metallization 216, 316 and 416 includes third conductive structure 214, 314, and 414 that extends in the second direction (along the Y-axis) and, at least partially, overlapping first conductive structure 210, 310, and 410 and the second conductive structure 212, 312, and 412. From block 508, flow proceeds to block 510.

At block 510 of method 500, a first via is formed between the first conductive structure and the third conductive structure and a second via is formed between the second conductive structure and the third conductive structure. As a non-limiting example, in the embodiments as shown in FIGS. 2B, 3A, 4B first via 218, 318, and 418 are electrically coupled between first conductive structure 210, 310, and 410 and third conductive structure 214, 314 and 414. Continuing the example, second via 219, 319, and 419 are electrically coupled between second conductive structure 212, 312, and 412 and third conductive structure 214, 314 and 414.

Figure 6A:
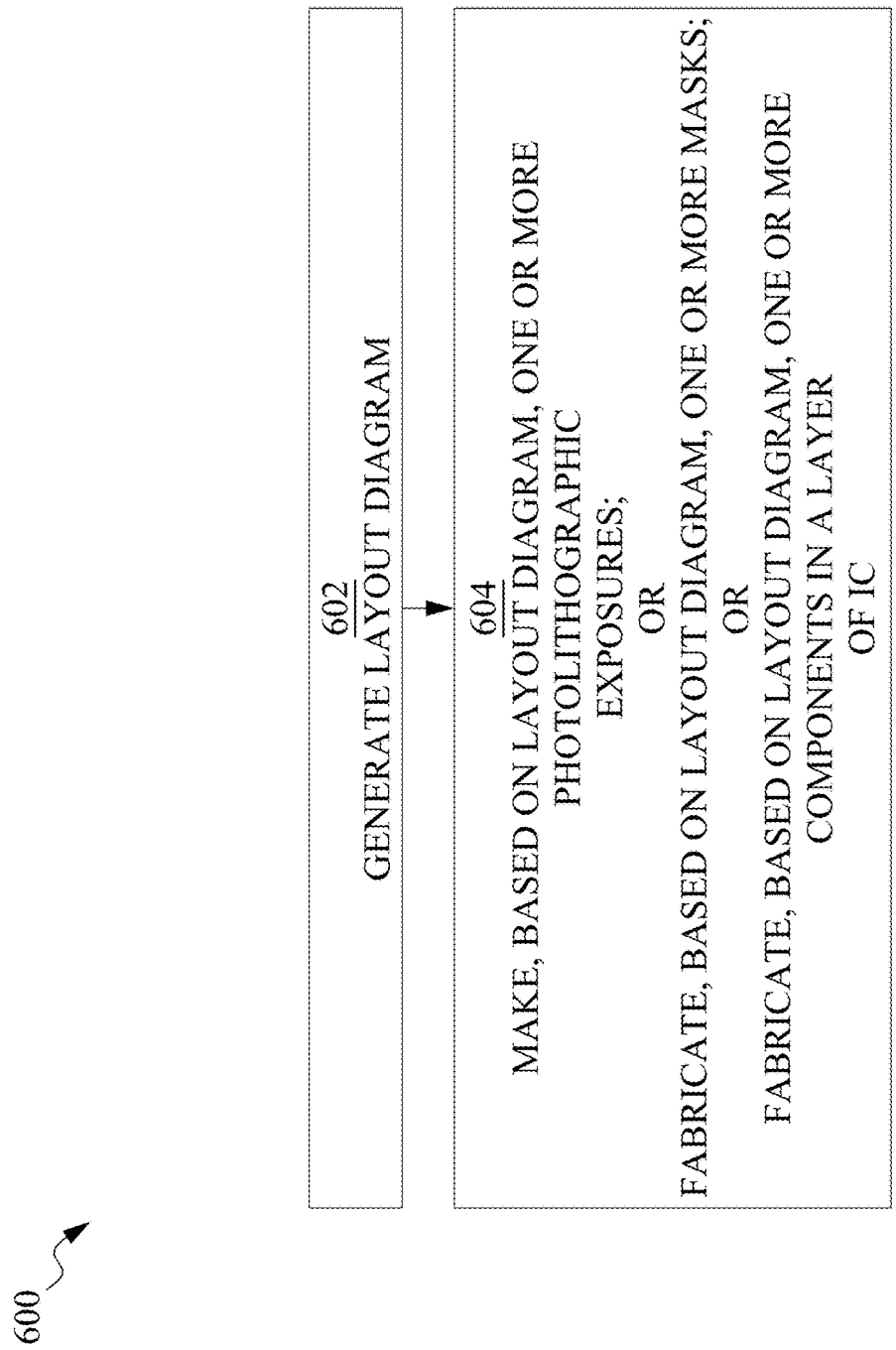
FIG. 6A is a flowchart of a method of manufacturing a semiconductor device, in accordance with some embodiments.

FIG. 6A is a flowchart of a method 600 of manufacturing a semiconductor device, in accordance with some embodiments.

Method 600 is implementable, for example, using EDA system 700 (FIG. 7, discussed below) and an integrated circuit (IC), manufacturing system 800 (FIG. 8, discussed below), in accordance with some embodiments. Examples of a semiconductor device which can be manufactured according to method 600 include IC 100 of FIG. 1, semiconductor devices corresponding to various ones of the layout diagrams disclosed herein, or the like.

In FIG. 6, method 600 includes blocks 602-604. At block 602, a layout diagram is generated which, among other things, includes one or more of layout diagrams disclosed herein, or the like. Block 602 is implementable, for example, using EDA system 700 (FIG. 7, discussed below), in accordance with some embodiments.

More particularly, block 602 includes generating shapes corresponding to structures in a semiconductor diagram which are to be represented. For example, regarding at block 602: where the layout diagram being generated corresponds to cell region 202A, block 602 includes generating shapes corresponding to the structures shown in cell region 202A; where the layout diagram being generated corresponds to cell region 202E, block 602 includes generating shapes corresponding to the structures shown in cell region 202E; where the layout diagram being generated corresponds to cell region 202F, block 602 includes generating shapes corresponding to the structures shown in cell region 202F; where the layout diagram being generated corresponds to cell region 302A, block 602 includes generating shapes corresponding to the structures shown in cell region 302A; where the layout diagram being generated corresponds to cell region 302B, block 602 includes generating shapes corresponding to the structures shown in cell region 302B; where the layout diagram being generated corresponds to cell region 302C, block 602 includes generating shapes corresponding to the structures shown in cell region 302C; or the like. From block 602, flow proceeds to block 604.

At block 604, based on the layout diagram, at least one of (A) one or more photolithographic exposures are made or (B) one or more semiconductor masks are fabricated or (C) one or more components in a layer of a semiconductor device are fabricated. See discussion below of FIG. 8.

Figure 6B:
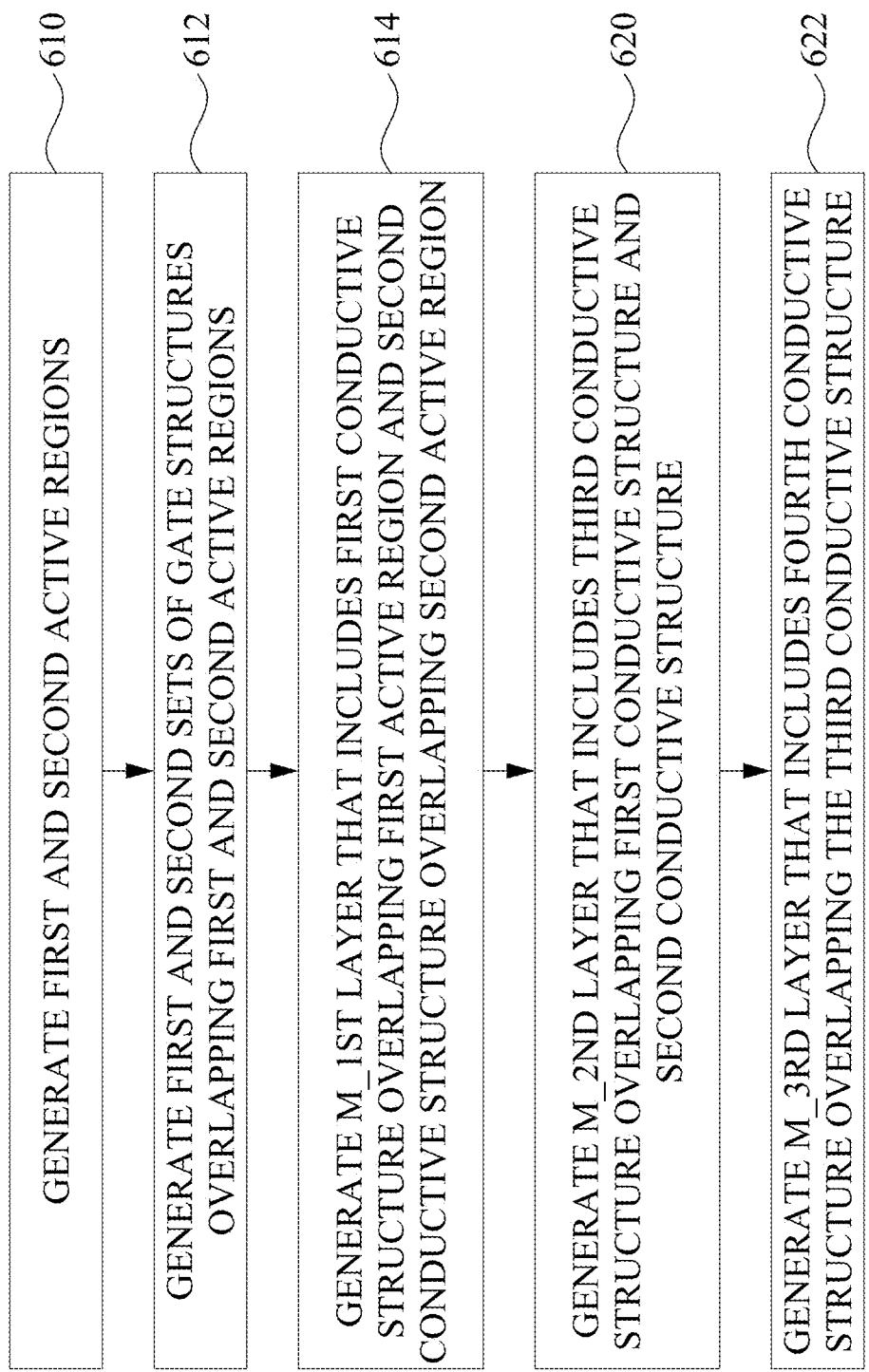
FIG. 6B is a flowchart of a method of generating a layout diagram for a semiconductor device, in accordance with some embodiments.

FIG. 6B is a flowchart of a method of generating a layout diagram, in accordance with some embodiments.

More particularly, the flowchart of FIG. 6B shows additional blocks included in block 602 of FIG. 6A, in accordance with one or more embodiments. Block 602 includes blocks 610-622. Method 600 is implementable, for example, using EDA system 700 (FIG. 7, discussed below) and an integrated circuit (IC), manufacturing system 800 (FIG. 8, discussed below), in accordance with some embodiments. Examples of a semiconductor device which can be manufactured according to method 600 include IC 100 of FIG. 1, semiconductor devices corresponding to various ones of the layout diagrams disclosed herein, or the like.

At block 610 of method 600, first and second active regions that extend in a first direction on a substrate are generated. In addition, the second active region is separated from the first active region in a second direction substantially perpendicular to the first direction. As a non-limiting example, in the embodiments as shown in FIGS. 2B, 3A, and 4B active regions 228, 232, 328, 332, 428 and 432 are generated atop or within the substrate. Continuing the example, first active regions 228, 328 and 428 extend in a first direction (along the X-axis). Second active regions 232, 332, and 432 also extend in the first direction, but are separated from first active regions 228, 328, and 428, perpendicularly in a second direction (along the Y-axis). From block 610, flow proceeds to block 612.

At block 612 of method 600, first and second sets of gate structures are generated extending in the second direction and overlapping the first and the second active regions. Non-limiting examples of the first set of gate structures includes sets 234, 334, and 434 of gate structures in corresponding FIGS. 2B, 3A and 4B that extend in the second direction (along the Y-axis) and overlap corresponding first active regions 228, 328, and 428, or the like. Non-limiting examples of the second set of gate structures includes sets 236, 336, and 435 of corresponding FIGS. 2B, 3A and 4B that extend in the second direction and overlap corresponding second active regions 232, 332, and 432. From block 612, flow proceeds to block 614.

At block 614 of method 600, an M_1$^{st}$ layer is generated that includes a first conductive structure extending in the first direction and overlapping the first active region and a second conductive structure extending in the first direction overlapping the second active region. Non-limiting examples of the first layer of metallization include M_1$^{st}$ layers 208, 308 and 408 of first layers of metallization in corresponding FIGS. 2B, 3A, and 4B. Non-limiting examples of the first conductive structure include conductive structures 210, 310, and 410 that extend in the first direction (along the X-axis) and overlap corresponding first active regions 228, 328, and 428 or the like. Non-limiting examples of the second conductive structure include conductive structures 212, 312, and 412 in corresponding FIGS. 2B, 3A, and 4B that extend in the first direction and overlap corresponding second active regions 232, 332, and 432. From block 614, flow proceeds to block 620.

At block 620 of method 600, an $M\_2^{nd}$ layer is generated that includes a third conductive structure that extends in the second direction and at least partially overlaps each of the first conductive structure and the second conductive structure. Non-limiting examples of the second layer of metallization includes M_2 nd layers 216, 316 and 416 in corresponding FIGS. 2B, 3A, and 4B. Non-limiting examples of the third conductive structure include conductive structure 214, 314, and 414 that extend in the second direction (along the Y-axis) and at least partially overlap corresponding first conductive structures 210, 310, and 410 and corresponding second conductive structures 212, 312, and 412. From block 620, flow proceeds to block 622.

At block 622 of method 600, an $M\_3^{rd}$ layer is generated that includes a fourth conductive structure that extends in the first direction and at least partially overlaps the third conductive structure. Non-limiting examples of the third layer of metallization include M_3rd layers 239, 339 or 443 in corresponding FIGS. 2C, 3B and 4C. Non-limiting examples of the fourth conductive structure include conductive structures 238, 338 and 438 that extend in the first direction (along the X-axis) and at least partially overlap corresponding third conductive structure 214, 314, 414 or the like.

Figure 7:
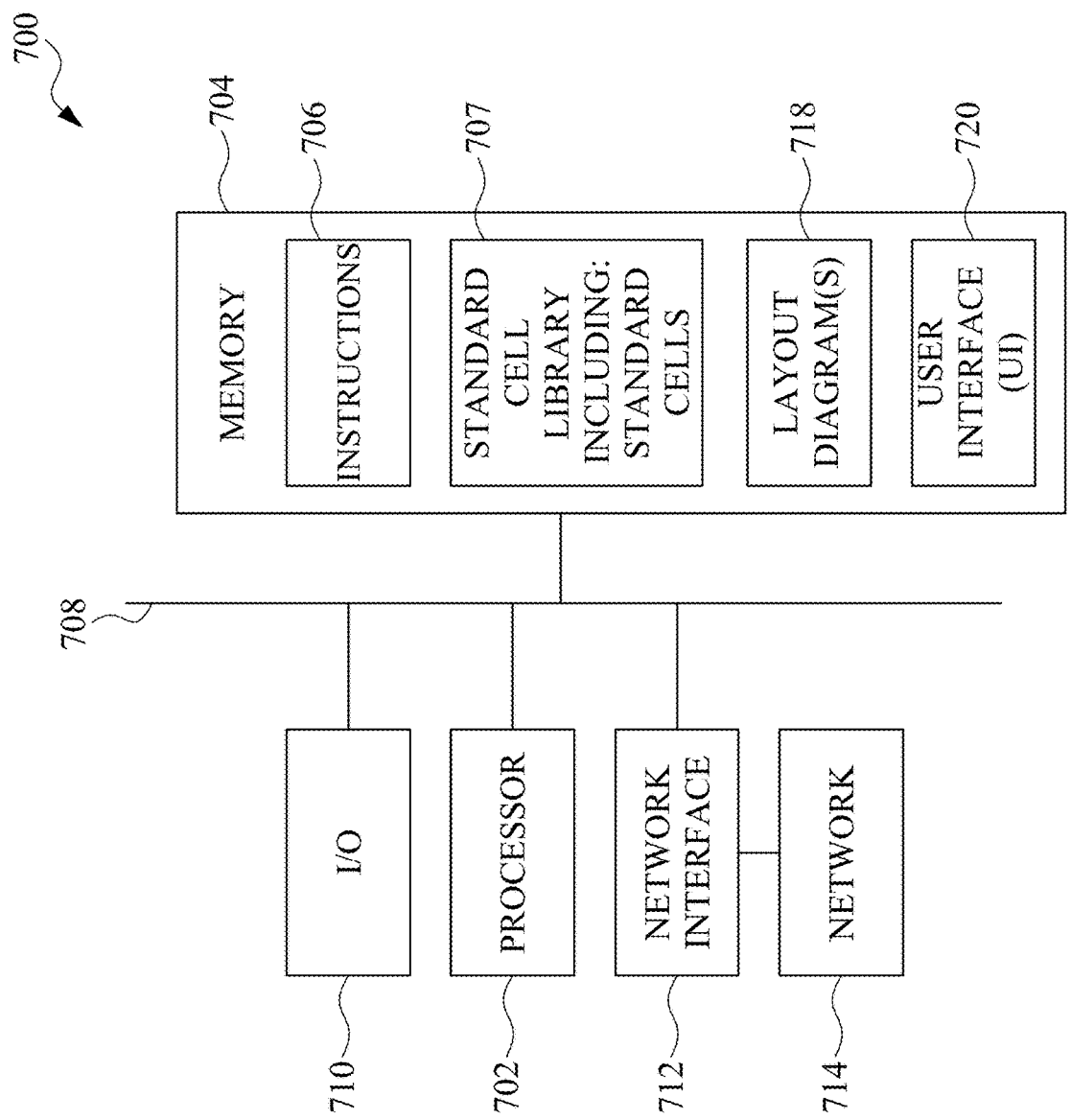
FIG. 7 is a block diagram of an electronic design automation (EDA) system in accordance with some embodiments.

FIG. 7 is a block diagram of an electronic design automation (EDA) system 700 in accordance with some embodiments.

In some embodiments, EDA system 700 includes an automatic placement and routing (APR) system. Methods described herein of designing layout diagrams represent wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of the methods described herein in accordance with one or more embodiments (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores library 716 of standard cells including such standard cells as disclosed herein. In one or more embodiments, storage medium 704 stores one or more layout diagrams 718 corresponding to one or more layouts disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 720.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
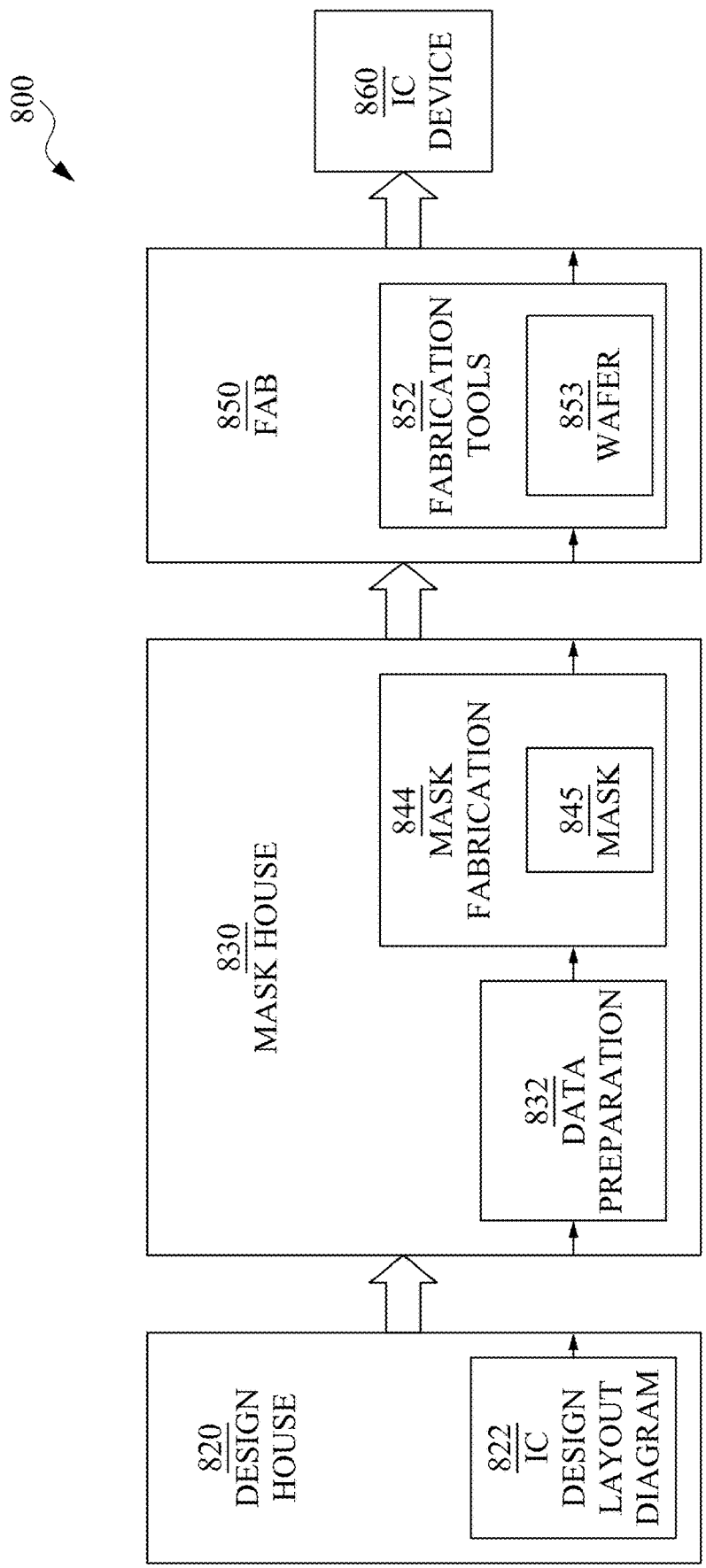
FIG. 8 is a block diagram of an IC manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for photolithographic implementation effects during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a current-distributing structure in an integrated circuit (IC) includes a substrate; first and second active regions that correspondingly extend in a first direction on the substrate, the second active region being separated from the first active region in a second direction substantially perpendicular to the first direction. The structure also includes first and second sets of gate structures extending in the second direction and correspondingly overlapping the first and second active regions. The structure also includes a first conductive structure in a first layer of metallization, the first conductive structure extending in the first direction, at least partially overlapping the first active region, and being electrically coupled to the first set of gate structures. The structure also includes a second conductive structure in the first layer of metallization, the second conductive structure extending in the first direction, at least partially overlapping the second active region, and being electrically coupled to the second set of gate structures. The structure also includes a third conductive structure in a second layer of metallization, the third conductive structure extending in the second direction, at least partially overlapping, and being electrically coupled to the first conductive structure and the second conductive structure.

Implementations may include one or more of the following features. The structure includes a fourth conductive structure in a third layer of metallization, the fourth conductive structure extending in the first direction, and the fourth conductive structure, at least partially overlapping, and being electrically coupled to the third conductive structure. The fourth conductive structure is located between the first active region and the second active region. The structure includes: a first via electrically coupled to the third conductive structure and the fourth conductive structure. The third conductive structure is located between the first and second sets of gate structures. The structure includes a first gate via (VG) electrically coupled to the first conductive structure and a first corresponding gate structure in the first set of gate structures; and a second VG electrically coupled to the second conductive structure and a second corresponding gate structure in the second set of gate structures. The structure includes a third VG electrically coupled to the first conductive structure and a third corresponding gate structure in the first set of gate structures. The structure includes: a third VG electrically coupled to the second conductive structure and a third corresponding gate structure in the second set of gate structures. The structure includes: a first via electrically coupled to the first conductive structure and the third conductive structure; and a second via electrically coupled to the second conductive structure and the third conductive structure. The first and the second conductive structure extend in the first direction and at least partially underneath the third conductive structure. The first conductive structure extends from the first set of gate structures to at least a portion of the second set of gate structures and the second conductive structure extends from the second set of gate structures to at least a portion of the first set of gate structures, where one or more gate structures of the first or the second set of gate structures is electrically coupled to both the first and the second conductive structure. The structure includes: for each of one or more gate structures from the first or second sets of gate structures, a corresponding dielectric structure which separates the gate structure into an upper portion and a lower portion, the dielectric structure representing an electrical discontinuity between the upper and lower portions. The one or more gate structures of the first or the second set of gate structures electrically coupled to the first conductive structure is different from the one or more gate structures of the first or the second set of gate structures electrically coupled to the second conductive structure.

In some embodiments, a method of manufacturing an integrated circuit (IC) to which corresponds layout diagram that is stored on a non-transitory computer-readable medium includes generating first and second active region shapes that correspondingly extend in a first direction on a substrate shape, the second active region shape being separated from the first active region shape in a second direction substantially perpendicular to the first direction; generating first and second sets of gate structure shapes extending in the second direction and correspondingly overlapping the first and second active region shapes; generating a first layer of metallization that includes a first conductive shape and a second conductive shape, the first conductive shape extending in the first direction, at least partially overlapping the first active region shape, and the second conductive shape extending in the first direction, at least partially overlapping the second active region shape; generating a second layer of metallization that includes a third conductive shape, the third conductive shape extending in the second direction at least partially overlapping the first conductive shape and the second conductive shape; and generating a third layer of metallization that includes a fourth conductive shape, the fourth conductive shape extending in the first direction, and at least partially overlapping the third conductive shape. Other embodiments of this aspect include corresponding computer systems, apparatus, and computer programs recorded on one or more computer storage devices, each configured to perform the actions of the methods.

Implementations may include one or more of the following features. The method where the generating the layout diagram further includes: generating a first gate via (VG) shape located between the first conductive shape and a first corresponding gate shape in the first set of gate shapes; and generating a second VG shape located between the second conductive shape and a second corresponding gate shape in the second set of gate shapes. The generating the layout diagram further includes: generating a first via shape located between the first conductive shape and the third conductive shape; and generating a second via shape located between the second conductive shape and the third conductive shape. The generating the layout diagram further includes: generating a first cut pattern on one or more gate shapes from the first and second sets of gate shape separating the one or more gate shapes from the first and second sets of gate shapes into an upper gate shape and a lower gate shape. Implementations of the described techniques may include hardware, a method or process, or computer software on a computer-accessible medium.

One general aspect includes a method of manufacturing an integrated circuit (IC). The method also includes fabricating first and second active regions that correspondingly extend in a first direction on a substrate, the second active region being separated from the first active region in a second direction substantially perpendicular to the first direction. The method also includes fabricating first and second sets of gate structures extending in the second direction and correspondingly overlapping the first and second active regions. The method also includes forming a first layer of metallization that includes a first conductive structure and a second conductive structure, the first conductive structure extending in the first direction, at least partially overlapping the first active region, and the second conductive structure extending in the first direction, at least partially overlapping the second active region. The method also includes forming a second layer of metallization that includes a third conductive structure, the third conductive structure extending in the second direction at least partially overlapping the first conductive structure and the second conductive structure. Other embodiments of this aspect include corresponding computer systems, apparatus, and computer programs recorded on one or more computer storage devices, each configured to perform the actions of the methods.

Implementations may include one or more of the following features. The method includes: forming a third layer of metallization that includes a fourth conductive structure, the fourth conductive structure extending in the first direction, and at least partially overlapping the third conductive structure. Implementations of the described techniques may include hardware, a method or process, or computer software on a computer-accessible medium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A current-distributing structure in an integrated circuit (IC), the structure comprising:
    a substrate;
    first and second active regions that correspondingly extend in a first direction on the substrate, the second active region being separated from the first active region in a second direction substantially perpendicular to the first direction;
    first and second sets of gate structures extending in the second direction and correspondingly overlapping the first and second active regions, wherein the first set of gate structures comprises a plurality of gate structures;
    a first conductive structure in a first layer of metallization, the first conductive structure extending in the first direction, at least partially overlapping the first active region, and being electrically coupled to each of the first set of gate structures;
    a second conductive structure in the first layer of metallization, the second conductive structure extending in the first direction, at least partially overlapping the second active region, and being electrically coupled to the second set of gate structures; and
    a third conductive structure in a second layer of metallization, the third conductive structure extending in the second direction, at least partially overlapping, and being electrically coupled to the first conductive structure and the second conductive structure.

2. The structure of claim 1, further comprising:
    a fourth conductive structure in a third layer of metallization, the fourth conductive structure extending in the first direction, and the fourth conductive structure, at least partially overlapping, and being electrically coupled to the third conductive structure.

3. The structure of claim 2, wherein the fourth conductive structure is located between the first active region and the second active region.

4. The structure of claim 2, further comprising:
    a first via electrically coupled to the third conductive structure and the fourth conductive structure.

5. The structure of claim 1, wherein the third conductive structure is located between the first and second sets of gate structures.

6. The structure of claim 1, further comprising:
a first gate via (VG) electrically coupled to the first conductive structure and a first corresponding gate structure in the first set of gate structures; and
a second VG electrically coupled to the second conductive structure and a second corresponding gate structure in the second set of gate structures.

7. The structure of claim 6, further comprising:
a third VG electrically coupled to the first conductive structure and a third corresponding gate structure in the first set of gate structures.

8. The structure of claim 6, further comprising:
a third VG electrically coupled to the second conductive structure and a third corresponding gate structure in the second set of gate structures.

9. The structure of claim 1, further comprising:
a first via electrically coupled to the first conductive structure and the third conductive structure; and
a second via electrically coupled to the second conductive structure and the third conductive structure.

10. The structure of claim 1, wherein the first and the second conductive structure extend in the first direction and at least partially underneath the third conductive structure.

11. The structure of claim 1, wherein the first conductive structure extends from the first set of gate structures to at least a portion of the second set of gate structures and the second conductive structure extends from the second set of gate structures to at least a portion of the first set of gate structures, wherein one or more gate structures of the first or the second set of gate structures is electrically coupled to both the first and the second conductive structure.

12. The structure of claim 11, further comprising:
for each of one or more of the gate structures from the first or second sets of gate structures, a corresponding dielectric structure which separates the gate structure into an upper portion and a lower portion, the dielectric structure representing an electrical discontinuity between the upper and lower portions.

13. The structure of claim 11, wherein the one or more gate structures of the first or the second set of gate structures electrically coupled to the first conductive structure is different from the one or more gate structures of the first or the second set of gate structures electrically coupled to the second conductive structure.

14. A current-distributing structure in an integrated circuit (IC), the structure comprising:
a substrate;
a first active region extending in a first direction;
a second active region extending in the first direction, the second active region being separated from the first active region in a second direction substantially perpendicular to the first direction;
a first plurality of gate structures extending in the second direction, wherein each of the first plurality of gate structures overlaps the first active region and the second active region;
a second plurality of gate structures extending in the second direction, wherein each of the second plurality of gate structures overlaps the first active region and the second active region, and the second plurality of gate structures is offset from the first plurality of gate structure in the first direction;
a first conductive structure a first distance from a top surface of the substrate, wherein the first conductive structure overlaps the first active region, and the first conductive structure is electrically connected to each of the first plurality of gate structures;
a second conductive structure the first distance from the top surface of the substrate, wherein the second conductive structure overlaps the second active region, and the second conductive structure is electrically connected to at least one of the second plurality of gate structures; and
a third conductive structure a second distance from the top surface of the substrate, wherein the third conductive structure is electrically connected to each of the first conductive structure and the second conductive structure, and the third conductive structure overlaps at least one of the first conductive structure or the second conductive structure.

15. The structure of claim 14, wherein the first conductive structure extends beyond a boundary of the first active region.

16. The structure of claim 14, wherein the second conductive structure extends beyond a boundary of the second active region.

17. The structure of claim 14, wherein an entirety of the first conductive structure overlaps the first active region.

18. The structure of claim 14, wherein an entirety of the second conductive structure overlaps the second active region.

19. The structure of claim 14, further comprising a third gate structure between the first plurality of gate structure and the second plurality of gate structures.

20. The structure of claim 19, wherein the third conductive structure is electrically between the third gate structure and at least one of the first conductive structure or the second conductive structure.

* * * * *